United States Patent
Saitoh et al.

(10) Patent No.: US 9,128,322 B2
(45) Date of Patent: Sep. 8, 2015

(54) PHASE DIFFERENCE PLATE FOR CIRCULARLY POLARIZING PLATE, CIRCULARLY POLARIZING PLATE, AND ORGANIC ELECTROLUMINESCENCE DISPLAY APPARATUS

(71) Applicant: FUJIFILM Corporation, Tokyo (JP)

(72) Inventors: Yukito Saitoh, Kanagawa (JP); Hiroshi Sato, Kanagawa (JP); Mitsuyoshi Ichihashi, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 16 days.

(21) Appl. No.: 14/223,427

(22) Filed: Mar. 24, 2014

(65) Prior Publication Data

US 2014/0284583 A1    Sep. 25, 2014

(30) Foreign Application Priority Data

Mar. 25, 2013    (JP) ................. 2013-062614

(51) Int. Cl.
*H01L 35/24* (2006.01)
*G02F 1/1335* (2006.01)
*H01L 51/52* (2006.01)
*H01L 27/32* (2006.01)

(52) U.S. Cl.
CPC ...... *G02F 1/133528* (2013.01); *H01L 51/5281* (2013.01); *G02F 2001/133541* (2013.01); *H01L 27/32* (2013.01)

(58) Field of Classification Search
CPC ................. H01L 51/5281; G02F 1/133528
USPC ............................................. 257/40, E51.001
See application file for complete search history.

(56) References Cited

FOREIGN PATENT DOCUMENTS

JP    3174367 A    3/2001

*Primary Examiner* — Anthony Ho
(74) *Attorney, Agent, or Firm* — Jean C. Edwards, Esq.; Edwards Neils PLLC

(57) ABSTRACT

The phase difference plate for a circularly polarizing plate including a first optically anisotropic layer, and a second optically anisotropic layer, in which the first optically anisotropic layer contains a liquid crystal compound helically aligned around a helical axis in its thickness direction, a helix angle of the liquid crystal compound in the first optically anisotropic layer is in a predetermined range, and an in-plane slow axis in a surface of the first optically anisotropic layer at the second optically anisotropic layer side is in parallel with an in-plane slow axis of the second optically anisotropic layer. The phase difference plate can sufficiently suppress the mixing of black with another color observed in the front direction when being stuck as a circularly polarizing plate on a display apparatus.

20 Claims, 5 Drawing Sheets

(A)

(B)

(A)

(B)

PHASE DIFFERENCE PLATE FOR CIRCULARLY POLARIZING PLATE, CIRCULARLY POLARIZING PLATE, AND ORGANIC ELECTROLUMINESCENCE DISPLAY APPARATUS

CROSS-REFERENCE TO RELATED APPLICATIONS

This application claims to Japanese Patent Application No. 2013-062614, filed on Mar. 25, 2013, the content of which is incorporated by reference into the present application in its entirety.

BACKGROUND OF THE INVENTION

The present invention relates to a phase difference plate for a circularly polarizing plate, particularly to a phase difference plate for a circularly polarizing plate that has an optically anisotropic layer containing a helically aligned liquid crystal compound.

The present invention also relates to a circularly polarizing plate or an organic electroluminescence (EL) display apparatus that has the phase difference plate for a circularly polarizing plate.

Phase difference plates are extremely versatile and are used for reflective LCDs, transflective LCDs, brightness enhancement films, organic EL display apparatuses, touch panels, and the like. For example, since organic EL devices have a structure in which layers having different refractive indices are laminated on each other or a structure which uses metallic electrodes, external light is reflected from the interfaces between the respective layers, and this leads to problems such as a decrease in contrast or reflection in some cases. Therefore, conventionally, in order to suppress negative effects caused by the reflection of external light, a circularly polarizing plate constituted with a phase difference plate and a polarizing film is used for organic EL display apparatuses, LCD display apparatuses, and the like.

Regarding a phase difference plate used for a circularly polarizing plate, for example, as described in JP 3174367 B, the use of a phase difference plate constituted with a λ/2 plate and a λ/4 plate is known.

SUMMARY OF THE INVENTION

Meanwhile, in recent years, display apparatuses represented by organic EL display apparatuses have been required to further suppress mixing of black with another color observed in the front direction so as to further improve the image quality. More specifically, currently, organic EL display apparatuses using a circularly polarizing plate have a problem that a coloring which is seemingly a mixture of black and another color (mixing of black with another color) is easily noticed when the apparatuses are viewed from the front direction.

The present inventors prepared a circularly polarizing plate by using the phase difference plate disclosed in JP 3174367 B, stuck the circularly polarizing plate on a display apparatus, and evaluated the performance thereof. As a result, they found that the mixing of black with another color observed in the front direction was not sufficiently suppressed.

The present invention has been made in consideration of the above problem, and an object thereof is to provide a phase difference plate which sufficiently suppresses the mixing of black with another color observed in the front direction when being stuck as a circularly polarizing plate on a display apparatus.

Another object of the present invention is to provide a circularly polarizing plate and an organic EL display apparatus that have the phase difference plate.

As a result of conducting thorough examination regarding the conventional technical problem, the present inventors found that the use of an optically anisotropic layer containing a helically aligned liquid crystal compound can solve the above problem.

That is, they found that the above objects can be achieved by the following constitution.

(1) A phase difference plate for a circularly polarizing plate comprising:
  a first optically anisotropic layer; and
  a second optically anisotropic layer,
  wherein the first optically anisotropic layer contains a liquid crystal compound that is helically aligned around a helical axis which is in a thickness direction of the first optically anisotropic layer,
  a helix angle of the liquid crystal compound in the first optically anisotropic layer is 81±10°,
  an in-plane slow axis in a surface of the first optically anisotropic layer at the second optically anisotropic layer side is in parallel with an in-plane slow axis of the second optically anisotropic layer, and
  a value of $\Delta nd$, which is a product of a refractive index anisotropy $\Delta n$ of the first optically anisotropic layer measured at a wavelength of 550 nm and a thickness d of the first optically anisotropic layer, and ReB(550) which is a value of retardation of the second optically anisotropic layer measured at a wavelength of 550 nm satisfy the following Formulae (1) and (2) respectively:

$$142 \text{ nm} \leq \Delta nd \leq 202 \text{ nm; and} \quad \text{Formula (1)}$$

$$151 \text{ nm} \leq ReB(550) \leq 211 \text{ nm.} \quad \text{Formula (2)}$$

(2) The phase difference plate for a circularly polarizing plate according to (1),
  wherein the second optically anisotropic layer contains a homogeneously aligned liquid crystal compound.
(3) The phase difference plate for a circularly polarizing plate according to (1) or (2),
  wherein the liquid crystal compound is a discotic liquid crystal compound or a rod-like liquid crystal compound.
(4) The phase difference plate for a circularly polarizing plate according to any one of (1) to (3),
  wherein there is substantially no alignment film between the first optically anisotropic layer and the second optically anisotropic layer.
(5) A circularly polarizing plate at least comprising:
  a polarizing film; and
  the phase difference plate for a circularly polarizing plate according to any one of (1) to (4),
  wherein the polarizing film, the second optically anisotropic layer, and the first optically anisotropic layer are laminated on one another in this order, and
  an angle formed between the in-plane slow axis of the second optically anisotropic layer and an absorption axis of the polarizing film is within a range of 13±10°, and an angle formed between the in-plane slow axis in a surface of the first optically anisotropic layer at a side opposite to the second optically anisotropic layer and the absorption axis of the polarizing film is within a range of 94±20°, or
  the angle formed between the in-plane slow axis of the second optically anisotropic layer and the absorption axis of the polarizing film is within a range of 103±10°, and the angle formed between the in-plane slow axis in the surface of the first optically anisotropic layer at a side opposite to the second optically anisotropic layer and the absorption axis of the polarizing film is within a range of 184±20°.

(6) A phase difference plate for a circularly polarizing plate comprising:
  a first optically anisotropic layer; and
  a second optically anisotropic layer,
  wherein the first optically anisotropic layer contains a liquid crystal compound that is helically aligned around an helical axis which is in a thickness direction of the first optically anisotropic layer,
  a helix angle of the liquid crystal compound in the first optically anisotropic layer is 59±10°,
  an in-plane slow axis in a surface of the first optically anisotropic layer at the second optically anisotropic layer side is orthogonal to an in-plane slow axis of the second optically anisotropic layer, and
  a value of $\Delta nd$, which is a product of a refractive index anisotropy $\Delta n$ of the first optically anisotropic layer measured at a wavelength of 550 nm and a thickness d of the first optically anisotropic layer, and ReB(550) which is a value of retardation of the second optically anisotropic layer measured at a wavelength of 550 nm satisfy the following Formulae (3) and (4) respectively:

$$203 \text{ nm} \leq \Delta nd \leq 263 \text{ nm; and} \qquad \text{Formula (3)}$$

$$158 \text{ nm} \leq ReB(550) \leq 218 \text{ nm.} \qquad \text{Formula (4)}$$

(7) The phase difference plate for a circularly polarizing plate according to (6),
  wherein the second optically anisotropic layer contains a homogeneously aligned liquid crystal compound.
(8) The phase difference plate for a circularly polarizing plate according to (6) or (7),
  wherein the liquid crystal compound is a discotic liquid crystal compound or a rod-like liquid crystal compound.
(9) The phase difference plate for a circularly polarizing plate according to any one of (6) to (9),
  wherein there is substantially no alignment film between the first optically anisotropic layer and the second optically anisotropic layer.
(10) A circularly polarizing plate at least comprising:
  a polarizing film; and
  the phase difference plate for a circularly polarizing plate according to any one of (6) to (9),
  wherein the polarizing film, the first optically anisotropic layer, and the second optically anisotropic layer are laminated on one another in this order, and
  an angle formed between the in-plane slow axis in a surface of the first optically anisotropic layer at the polarizing film side and the absorption axis of the polarizing film is within a range of 123±10°, and an angle formed between the in-plane slow axis of the second optically anisotropic layer and the absorption axis of the polarizing film is within a range of 26±20°, or
  the angle formed between the in-plane slow axis in the surface of the first optically anisotropic layer at the polarizing film side and the absorption axis of the polarizing film is within a range of 33±10°, and the angle formed between the in-plane slow axis of the second optically anisotropic layer and the absorption axis of the polarizing film is within a range of 116±20°.

(11) An organic electroluminescence display apparatus comprising:
  the phase difference plate according to any one of (1) to (4) and (6) to (9); or
  the circularly polarizing plate according to (5) or (10).

According to the present invention, it is possible to provide a phase difference plate which can sufficiently suppress the mixing of black with another color observed in the front direction when being stuck as a circularly polarizing plate on a display apparatus.

Moreover, according to the present invention, it is possible to provide a circularly polarizing plate and an organic EL display apparatus that have the phase difference plate.

BRIEF DESCRIPTION OF THE DRAWINGS

FIG. 4A is a perspective view of the circularly polarizing plate except a transparent support, and FIG. 4B is a schematic view showing the angular relationship between the absorption axis of the polarizing film 18 and the in-plane slow axis of each of the first optically anisotropic layer 12a and the second optically anisotropic layer 14a observed in the direction of the white arrow of FIG. 4A.

FIG. 5A is a perspective view of the circularly polarizing plate except a transparent support, and FIG. 5B is a schematic view showing the angular relationship between the absorption axis of the polarizing film 18 and the in-plane slow axis of each of the first optically anisotropic layer 12a and the second optically anisotropic layer 14a observed in the direction of the white arrow of FIG. 5A.

FIG. 8A is a perspective view of the circularly polarizing plate except a transparent support, and FIG. 8B is a schematic view showing the angular relationship between the absorption axis of the polarizing film 18 and the in-plane slow axis of each of the first optically anisotropic layer 12b and the second optically anisotropic layer 14b observed in the direction of the white arrow of FIG. 8A.

FIG. 9A is a perspective view of the circularly polarizing plate except a transparent support, and FIG. 9B is a schematic view showing the angular relationship between the absorption axis of the polarizing film 18 and the in-plane slow axis of each of the first optically anisotropic layer 12b and the second optically anisotropic layer 14b observed in the direction of the white arrow of FIG. 9A.

DETAILED DESCRIPTION OF THE INVENTION

Figure 1:
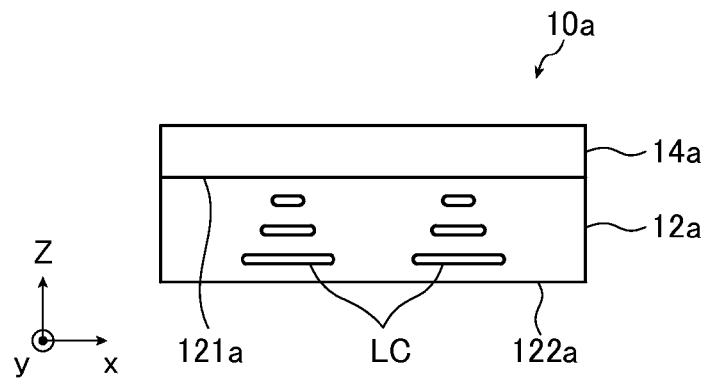
FIG. 1 is an example of a schematic cross-sectional view of a first embodiment of the phase difference plate for a circularly polarizing plate of the present invention.

Hereinafter, the present invention will be described in detail. In the present specification, a range of numerical values that is indicated using "to" means a range in which numerical values before and after "to" are included therein as a lower limit and an upper limit. First, terms used in the present specification will be described.

Re ($\lambda$) and Rth ($\lambda$) represent in-plane retardation and thickness-direction retardation at a wavelength $\lambda$ respectively. Re ($\lambda$), Rth ($\lambda$) and $\Delta$nd are measured by Axoscan (manufactured by Axometrics).

In the present specification, "visible light" refers to light having a wavelength of 380 nm to 780 nm. Moreover, in the present specification, the measurement wavelength is 550 nm unless otherwise specified.

In addition, in the present specification, the angular relationship (for example, "orthogonal", "parallel", and the like) includes a margin of error allowable in the technical field to which the present invention belongs. Specifically, the margin of error is within a range less than a precise angle ±10°. A difference between the precise angle and the angle in the angular relationship is preferably 5° or less and more preferably 3° or less.

Hereinafter, the preferable embodiments of the phase difference plate for a circularly polarizing plate of the present invention will be described in detail.

One of the characteristics of the present invention is that the present invention is a multilayer-type phase difference plate having an optically anisotropic layer (hereinafter, referred to as a "first optically anisotropic layer") containing a helically aligned liquid crystal compound. To be more specific, by controlling $\Delta$nd of the first optically anisotropic layer, a helix angle of the liquid crystal compound of the first optically anisotropic layer, and retardation of a second optically anisotropic layer having an in-plane slow axis which has a predetermined relationship with an in-plane slow axis of the first optically anisotropic layer, it is possible to realize a broadband $\lambda/4$ plate that can convert linearly-polarized light of a broader range of wavelength into a more complete circularly-polarized light, compared to the known phase difference plate constituted with $\lambda/4$ and $\lambda/2$ plates.

Generally, when two optically anisotropic layers are laminated on each other by using a liquid crystal compound, an alignment film is formed, a first optically anisotropic layer is formed on the alignment film, another alignment film is then formed again on the first optically anisotropic layer, and then a second optically anisotropic layer is formed on the alignment film. That is, the alignment film needs to be prepared twice.

In contrast, in the phase difference plate of the present invention, the liquid crystal compound contained in one of the optically anisotropic layers is helically aligned, hence provision of the alignment film can be performed in one step. More specifically, after the alignment film is formed, if the first optically anisotropic layer containing the helically aligned liquid crystal compound is formed on the alignment film, the in-plane slow axis in the exposed surface of the first optically anisotropic layer rotates more by a predetermined angle than the in-plane slow axis in the surface where the alignment film is present. Accordingly, if the surface of the first optically anisotropic layer is further coated with the liquid crystal compound, the liquid crystal compound is aligned along the in-plane slow axis of the exposed surface that has a predetermined angular relationship with the in-plane slow axis in the surface of the first optically anisotropic layer where the alignment film is present, and this saves the trouble of additionally providing the alignment film.

First Embodiment

Hereinafter, a first embodiment of the phase difference plate for a circularly polarizing plate (hereinafter, simply referred to as a "phase difference plate" in some cases) of the present invention will be described with reference to a drawing. FIG. 1 is a schematic cross-sectional view of the first embodiment of the phase difference plate of the present invention.

A phase difference plate 10a has a first optically anisotropic layer 12a and a second optically anisotropic layer 14a. The first optically anisotropic layer 12a contains a liquid crystal compound LC that is helically aligned around a helical axis which is in the thickness direction of the layers. The phase difference plate 10a may optionally include a transparent support which will be described later.

Hereinafter, the constitution of each layer will be described in detail.

First Optically Anisotropic Layer 12a

As shown in FIG. 1, the first optically anisotropic layer 12a contains the liquid crystal compound LC that is helically aligned around a helical axis which is in the thickness direction (z-axis direction in FIG. 1) of the layer. It is preferable for the first optically anisotropic layer 12a to exhibit a chiral nematic phase, a cholesteric phase, or the like which has a so-called helical structure. The liquid crystal compound LC will be described later. However, as the liquid crystal compound LC used for the first optically anisotropic layer 12a, liquid crystal compounds exhibiting a nematic liquid crystal phase are preferably used. For forming the aforementioned phase, it is preferable to use a mixture of a liquid crystal compound exhibiting a nematic liquid crystal phase and a chiral agent which will be described later.

The helix angle of the liquid crystal compound LC (helix angle of the liquid crystal compound LC in the alignment direction) is 81±10°, and in view of further reducing a degree of the mixing of black with another color observed in the front direction that is caused when the phase difference plate of the present invention is pasted as a circularly polarizing plate to a display apparatus (hereinafter, this will be simply described as "in view of making the effects of the present invention better" in some cases), the helix angle is more preferably 81±8° and even more preferably 81±6°.

If the helix angle is less than 71° and exceeds 91°, when the phase difference plate of the present invention is pasted as a circularly polarizing plate to a display apparatus, the mixing of black with another color observed in the front direction occurs to a large extent.

The helix angle is measured by an apparatus Axoscan (polarimeter) manufactured by Axometrics, Inc. and by using analytical software from the same company.

When a liquid crystal compound is helically aligned, this means that the liquid crystal forms a helix around an axis, which is in the thickness direction of the first optically anisotropic layer 12a, from the main surface at one side of the first optically anisotropic layer 12a to the main surface at the other side thereof. As a result, the alignment direction (in-plane slow axis direction) of the liquid crystal compound varies with the position of the thickness direction of the first optically anisotropic layer 12a.

There are two kinds of helix directions, and the helix may be a right-handed helix or a left-handed helix. In FIG. 1, the right-handed helix refers to the right-handed helix (clockwise helix) observed when phase difference plate is seen from the second optically anisotropic layer 14a toward the first optically anisotropic layer 12a.

A value of Δnd as a product of a refractive index anisotropy Δn of the first optically anisotropic layer 12a that is measured at a wavelength of 550 nm and a thickness d of the first optically anisotropic layer satisfies the following Formula (1).

$$142 \text{ nm} \leq \Delta nd \leq 202 \text{ nm} \qquad \text{Formula (1)}$$

Particularly, in view of making the effects of the present invention better, Δnd preferably satisfies Formula (1A) and more preferably satisfies Formula (1B).

$$152 \text{ nm} \leq \Delta nd \leq 192 \text{ nm} \qquad \text{Formula (1A)}$$

$$162 \text{ nm} \leq \Delta nd \leq 182 \text{ nm} \qquad \text{Formula (1B)}$$

When Δnd is less than 142 nm and exceeds 202 nm, the mixing of black with another color observed in the front direction that is caused when the phase difference plate of the present invention is pasted as a circularly polarizing plate to a display apparatus occurs to a large extent.

The refractive index anisotropy Δn refers to the refractive index anisotropy of the optically anisotropic layer.

Similarly to the measurement of the helix angle, Δnd is measured by using Axoscan (polarimeter) manufactured by Axometrics, Inc. and analytical software from the same company.

Second Optically Anisotropic Layer 14a

Unlike the first optically anisotropic layer 12a, the second optically anisotropic layer 14a is a layer containing a homogeneously aligned liquid crystal compound. "Homogeneously aligned" means an alignment state in which the liquid crystal compound is aligned in a direction in parallel with a certain direction.

FIG. 1 shows an embodiment in which the second optically anisotropic layer 14a contains the homogeneously aligned liquid crystal compound. However, the second optically anisotropic layer 14a may be constituted with other materials as long as a predetermined relationship is established between the in-plane slow axis of the second optically anisotropic layer 14a and the in-plane slow axis of the first optically anisotropic layer 12a. For example, the second optically anisotropic layer 14a may be formed of a polymer film (particularly, a polymer film having undergone stretch processing).

ReB(550), which is a value of retardation (in-plane retardation) of the second optically anisotropic layer 14a and measured at a wavelength of 550 nm, satisfies the following Formula (2).

$$151 \text{ nm} \leq ReB(550) \leq 211 \text{ nm} \qquad \text{Formula (2)}$$

Particularly, in view of making the effects of the present invention better, ReB(550) preferably satisfies Formula (2A) and more preferably satisfies Formula (2B).

$$161 \text{ nm} \leq ReB(550) \leq 201 \text{ nm} \qquad \text{Formula (2A)}$$

$$171 \text{ nm} \leq ReB(550) \leq 191 \text{ nm} \qquad \text{Formula (2B)}$$

When ReB(550) is less than 151 nm and exceeds 211 nm, mixing of black with another color observed in the front direction that is caused when the phase difference plate of the present invention is pasted as a circularly polarizing plate to a display apparatus occurs to a large extent.

Similarly to the measurement of the helix angle, the value of retardation of the second optically anisotropic layer 14a is measured by a method of using Axoscan (polarimeter) manufactured by Axometrics, Inc. and analytical software from the same company.

The in-plane slow axis of the first optically anisotropic layer 12a that is in a surface 121a at the side of the second optically anisotropic layer 14a is disposed so as to be in parallel with the in-plane slow axis of the second optically anisotropic layer 14a. The definition of "parallel" is as described above.

As described above, the liquid crystal compound in the first optically anisotropic layer 12a is helically aligned around a helical axis which is in the thickness direction of the layer, and the in-plane slow axis of the first optically anisotropic layer 12a is twisted toward a surface 122a from the surface 121a. The angle formed between the in-plane slow axis in the surface 121a of the first optically anisotropic layer 12a and the in-plane slow axis in the surface 122a thereof is 81±10° as described above.

An alignment film, which will be described later, may be disposed between the first optically anisotropic layer 12a and the second optically anisotropic layer 14a. However, as shown in FIG. 1, it is preferable that the first optically anisotropic layer 12a be adjacent to the second optically anisotropic layer 14a, and there be substantially no alignment film between the first optically anisotropic layer 12a and the second optically anisotropic layer 14a. When there is substantially no alignment film between the first optically anisotropic layer 12a and the second optically anisotropic layer 14a, covalent bonds formed between compounds contained in each of the optically anisotropic layers can be utilized, whereby better adhesiveness is obtained.

Moreover, as described above, since the first optically anisotropic layer 12a contains a helically aligned liquid crystal compound, it is possible to obtain a desired phase difference plate without performing rubbing processing. More specifically, when the first optically anisotropic layer 12a is prepared, and then the second optically anisotropic layer 14a is prepared thereon by using a liquid crystal compound, the in-plane slow axis of the first optically anisotropic layer 12a faces different directions in the surface 122a and the surface 121a. Accordingly, even if rubbing processing is not performed, simply by coating the surface 121a with a liquid crystal compound, the liquid crystal compound is aligned according to the alignment state of the surface 121a, whereby a desired phase difference plate can be obtained.

In the present specification, "there is substantially no alignment film" means that the phase difference plate does not have a film which is formed only for functioning as an alignment film. The present invention also includes a case where the surface of a layer placed in the lower part contributes to the alignment of the liquid crystal compound of the layer placed in the upper part, as long as the layer placed in the lower part is not a layer formed only for being used as an alignment film.

The type of liquid crystal compound used for forming the first optically anisotropic layer 12a or the second optically anisotropic layer 14a is not particularly limited. For example, it is possible to use an optically anisotropic layer, which is obtained by forming nematic alignment of low-molecular weight liquid crystalline compound in a liquid crystalline state and then fixing the alignment by photocrosslinking or thermal crosslinking, or an optically anisotropic layer which is obtained by forming nematic alignment of polymeric liquid crystalline compound in a liquid crystalline state and then fixing the alignment by cooling.

Generally, liquid crystal compounds are classified into rod types (rod-like liquid crystal compounds) and disk types (discotic liquid crystal compounds) according to their shape, and further classified into low-molecular weight types and polymer types. A polymer refers to a compound having a degree of polymerization of 100 or higher in general (Polymer physics-Phase Transition Dynamics, Masao DOI, p. 2, Iwanami Shoten, Publishers., 1992). In the present invention, any of the liquid crystal compounds can be used. However, it is preferable to use rod-like liquid crystal compounds or discotic liquid crystal compounds. Moreover, two or more kinds of rod-like liquid crystal compounds, two or more kinds of discotic liquid crystal compounds, or a mixture of a rod-like liquid crystal compound and a discotic liquid crystal compound may be used.

As the rod-like liquid crystal compound, for example, those described in Claim 1 of JP 11-513019 A or paragraphs [0026] to of JP 2005-289980 A can be preferably used. As the discotic liquid crystal compound, for example those described in paragraphs [0020] to [0067] of JP 2007-108732 A or paragraphs [0013] to [0108] of JP 2010-244038 A can be preferably used. However, the present invention is not limited to these.

It is more preferable for the first or second optically anisotropic layer 12a or 14a to be formed of the rod-like liquid crystal compound or the discotic liquid crystal compound having polymerizable groups, since changes thereof due to temperature or humidity can be reduced. The liquid crystal compound may be a mixture of two or more kinds thereof, and in this case, at least one of the liquid crystal compounds has two or more polymerizable groups.

That is, the first or second optically anisotropic layer 12a or 14a is preferably a layer formed of the rod-like liquid crystal compound or the discotic liquid crystal compound that has polymerizable groups and is fixed by polymerization or the like. In this case, the formed layer does not need to exhibit liquid crystallinity.

The type of the polymerizable groups contained in the discotic liquid crystal compound and the rod-like liquid crystal compound is not particularly limited. The polymerizable groups are preferably functional groups that can cause an addition polymerization reaction, or preferably ethylneically unsaturated polymerizable groups or cyclic polymerizable groups. More specifically, examples thereof include (meth) acryloyl groups, vinyl groups, styryl groups, allyl groups, and the like, and among these, (meth)acryloyl groups are more preferable.

The phase difference plate of the present invention can be prepared by various methods, and an example thereof is as follows.

First, a support such as a polymer film or a glass plate is prepared, and then an alignment film is optionally formed on the support. The surface of the support or the surface of the alignment film is coated with a composition for forming a first optically anisotropic layer that contains a liquid crystal compound having polymerizable groups and contains additives such as a chiral agent as desired, whereby a coating film is formed. The coating film is heated as desired such that the molecules of liquid crystal compound contained in the coating film are helically aligned, and then the resultant is cooled to the temperature for solidifying the resultant. Then the resultant is subjected to polymerization by curing processing (UV irradiation (light irradiation processing) or heating processing) to fix the helix alignment, whereby a first optically anisotropic layer having optical rotation is obtained. The coating of the liquid crystal composition can be performed by conducting coating of coating liquid of the liquid crystal compound composition containing a solvent, which will be described later, by means of known methods (for example, a wire bar coating method, an extrusion coating method, a direct gravure coating method, a reverse gravure coating method, and die coating method). Moreover, the first optically anisotropic layer may be formed by ejecting the coating liquid by using an inkjet apparatus.

Thereafter, the surface of the first optically anisotropic layer (or the surface of an alignment film which is optionally formed on the first optically anisotropic layer) is coated with a composition for forming a second optically anisotropic layer that contains a liquid crystal compound having polymerizable groups, whereby a coating film is formed. Subsequently, the polymerizable group-containing liquid crystal compound in an aligned state is subjected to curing processing (heating processing or light irradiation processing) to form the second optically anisotropic layer.

Polymerization Initiator

It is preferable for the aligned (preferably vertically aligned) liquid crystal compound to be fixed while maintaining the aligned state. It is preferable for the liquid crystal compound to be fixed by a polymerization reaction of the polymerizable groups introduced to the liquid crystal compound by using a polymerization initiator. The polymerization reaction includes a thermal polymerization reaction using a thermal polymerization initiator and a photopolymerization reaction using a photopolymerization initiator. Particularly, a photopolymerization reaction is preferable.

The amount of the polymerization initiator used is preferably 0.01% by mass to 20% by mass and more preferably 0.5% by mass to 5% by mass of solid contents of the composition.

Chiral Agent

For forming the first optically anisotropic layer 12a, a chiral agent may be optionally used as desired together with the above liquid crystal compound. The chiral agent is added to helically align the liquid crystal compound. Needless to say, when the liquid crystal compound is an optically active compound such as a compound having chiral carbon in the molecule, the addition of the chiral agent is not necessary. Moreover, depending on the production method and the helix angle, the addition of the chiral agent is not necessary.

The chiral agent is not particularly limited in terms of the structure, as long as the chiral agent is compatible with the liquid crystal compound used concurrently. It is possible to use any of known chiral agents (for example, those described in "Liquid Crystal Device Handbook" edited by the $142^{nd}$ committee of Japan Society for the Promotion of Science, Chapter 3, Section 4-3, Chiral agents for TN and STN, p. 199, 1989). The chiral agent generally contains chiral carbon atoms. However, axially asymmetric compounds or planar asymmetric compounds not containing chiral carbon atoms can also be used as the chiral agent. Examples of the axially asymmetric compounds or planar asymmetric compounds include binaphthyl, helicene, paracyclophane, and derivatives of these. Moreover, the chiral agent may have liquid crystallinity.

Other Additives for Optically Anisotropic Layer

The above liquid crystal compound can be concurrently used with a plasticizer, a surfactant, a polymerizable monomer, and the like to improve uniformity of the coating film, film strength, alignment properties of the liquid crystal compound, and the like. It is preferable for those materials used concurrently to be compatible with the liquid crystal compound and not to hinder the alignment.

Moreover, in order to horizontally or vertically align the liquid crystal compound, an additive (alignment control agent) for promoting the horizontal or vertical alignment may be used. As the additive, various known materials can be used.

Examples of the polymerizable monomer include radically polymerizable monomers and cationically polymerizable monomers. Among these, radically polymerizable polyfunctional monomers that can be copolymerized with the aforementioned polymerizable group-containing liquid crystal compounds are preferable. Examples thereof include those described in paragraphs [0018] to [0020] in JP 2002-296423 A. The amount of the above compounds added is generally in a range of 1% by mass to 50% by mass, and preferably in a range of 5% by mass to 30% by mass, based on the liquid crystalline molecules.

Examples of the surfactant include conventionally known compounds, and among these, fluorine-based compounds are particularly preferable. Specific examples thereof include compounds described in paragraphs [0028] to [0056] of JP 2001-330725 A and paragraphs [0069] to [0126] in Japanese Patent Application No. 2003-295212.

It is preferable for the polymer used concurrently with the liquid crystal compound to be able to thicken the coating liquid. Examples of the polymer include cellulose esters. Preferable examples of the cellulose esters include those described in a paragraph [0178] of JP 2000-155216 A. The amount of the polymer added is preferably in a range of 0.1% by mass to 10% by mass, and more preferably in a range of 0.1% by mass to 8% by mass, based on the liquid crystalline molecules, such that the alignment of the liquid crystal compound is not hindered.

The discotic nematic liquid crystal phase-solid phase transition temperature of the liquid crystal compound is preferably 70° C. to 300° C. and more preferably 70° C. to 170° C.

Coating Solvent

As the solvent used for preparing the composition (coating liquid), organic solvents are preferably used. Examples of the organic solvents include amide (for example, N,N-dimethylformamide), sulfoxide (for example, dimethyl sulfoxide), heterocyclic compounds (for example, pyridine), hydrocarbon (for example, benzene and hexane), alkyl halide (for example, chloroform and dichloromethane), ester (for example, methyl acetate, ethyl acetate, and butyl acetate), ketone (for example, acetone and methyl ethyl ketone), and ether (for example, tetrahydrofuran and 1,2-dimethoxyethane). Among these, alkyl halide and ketone are preferable. Two or more kinds of organic solvents may be concurrently used.

Alignment Film

In the present invention, the composition for forming the first optically anisotropic layer or the composition for forming the second optically anisotropic layer may be applied to the surface of an alignment film to align molecules of the liquid crystal compound (for example, a discotic liquid crystal compound). The alignment film functions to determine the alignment direction of the liquid crystal compound. Accordingly, it is preferable for the alignment film to be used to realize preferable modes of the present invention. However, if the alignment state of the liquid crystal compound is fixed after the compound is aligned, the role of the alignment film is no longer required. Therefore, the alignment film is not an essential constituent of the present invention.

The alignment film can be provided by means of rubbing processing of an organic compound (preferably a polymer), oblique deposition of an inorganic compound, formation of a layer having mocrogrooves, or accumulation of organic compounds (for example, ω-tricosanoic acid, dioctadecyl methyl ammonium chloride, and methyl stearate) by the Langmuir-Blodgett method (LB film). Moreover, an alignment film which obtains an aligning function by being provided with electric or magnetic field or being irradiated with light (preferably polarized light) is known.

It is preferable for the alignment film to be formed by rubbing processing of a polymer.

Examples of the polymer include the polymers described in a paragraph [0022] of JP 8-338913 A such as methacrylate-based copolymers, styrene-based copolymers, polyolefin, polyvinyl alcohol, modified polyvinyl alcohol, poly(N-methylolacrylamide), polyester, polyimide, vinyl acetate copolymers, carboxymethyl cellulose, polycarbonate, and the like. Silane coupling agents can be used as the polymer. Among these, water-soluble polymers (for example, poly(N-methylolacrylamide), carboxymethyl cellulose, gelatin, polyvinyl alcohol, and modified polyvinyl alcohol) are preferable, gelatin, polyvinyl alcohol, and modified polyvinyl alcohol are more preferable, and polyvinyl alcohol and modified polyvinyl alcohol are most preferable.

Basically, the alignment film can be formed by coating the surface of a transparent support with a solution, which contains the aforementioned polymer as a material for forming the alignment film and any additive (for example, a crosslinking agent), then drying (crosslinking) the resultant by heating, followed by rubbing processing.

As the rubbing processing, it is possible to use a processing method that is widely used as liquid crystal alignment process of LCD. That is, it is possible to use a method in which the surface of the alignment film is rubbed with paper, gauze, felt, rubber, nylon, polyester fiber, and the like in a certain direction to obtain the aligning function. Usually, the rubbing processing is performed by rubbing about several times the alignment film with cloth or the like in which fibers having the uniform length and thickness are evenly implanted.

Second Embodiment

Figure 2:
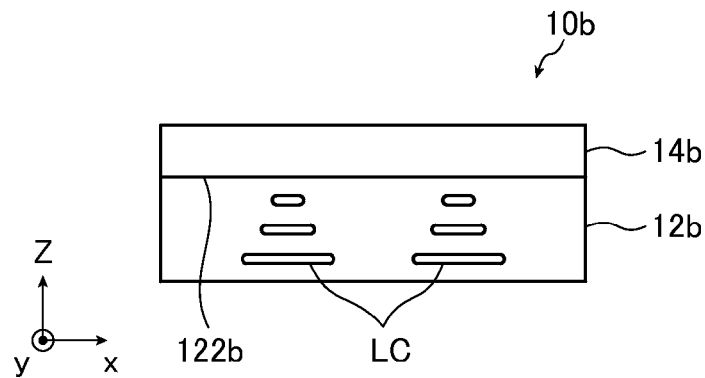
FIG. 2 is an example of a schematic cross-sectional view of a second embodiment of the phase difference plate for a circularly polarizing plate of the present invention.

Hereinafter, a second embodiment of the phase difference plate for a circularly polarizing plate (hereinafter, simply referred to as a "phase difference plate" in some cases) of the present invention will be described with reference to a drawing. FIG. 2 is a schematic cross-sectional view of the second embodiment of the phase difference plate of the present invention.

A phase difference plate 10b has a first optically anisotropic layer 12b and a second optically anisotropic layer 14b. The first optically anisotropic layer 12b contains the liquid crystal compound LC that is helically aligned around a helical axis which is in the thickness direction of the layer.

Similarly to the phase difference plate 10a, the phase difference plate 10b is constituted with two optically anisotropic layers. However, it differs from the phase difference plate 10a in terms of retardation of the optically anisotropic layer, the helix angle of the liquid crystal compound, and the like.

Hereinafter, the constitution of each layer will be described in detail.

First Optically Anisotropic Layer 12b

Similarly to the first optically anisotropic layer 12a shown in FIG. 1, the first optically anisotropic layer 12b contains the liquid crystal compound LC that is helically aligned around a helical axis which is in the thickness direction (z-axis direction in FIG. 2) of the layer. The preferable embodiment of the liquid crystal compound LC is as described above.

The helix angle of the liquid crystal compound LC is 59±10°, and in view of further reducing a degree of the mixing of black with another color observed in the front direction that is caused when the phase difference plate of the present invention is pasted as a circularly polarizing plate to a display apparatus (hereinafter, this will be simply described as "in view of making the effects of the present invention better" in some cases), the helix angle is more preferably 59±8° and even more preferably 59°±6°.

If the helix angle is less than 49° and exceeds 69°, when the phase difference plate of the present invention is pasted as a circularly polarizing plate to a display apparatus, the mixing of black with another color observed in the front direction occurs to a large extent.

The helix angle is measured by the method described above.

There are two kinds of helix directions, and the helix may be a right-handed helix or a left-handed helix. In FIG. 2, the right-handed helix refers to the right-handed helix (clockwise helix) observed when phase difference plate is seen from the second optically anisotropic layer 14b toward the first optically anisotropic layer 12b.

A value of Δnd as a product of a refractive index anisotropy Δn of the first optically anisotropic layer 12b (the liquid crystal compound of the first optically anisotropic layer 12b) that is measured at a wavelength of 550 nm and a thickness d of the first optically anisotropic layer 12b satisfies the following Formula (3).

$$203 \text{ nm} \leq \Delta nd \leq 263 \text{ nm} \quad \text{Formula (3)}$$

Particularly, in view of making the effects of the present invention better, Δnd preferably satisfies Formula (3A) and more preferably satisfies Formula (3B).

$$213 \text{ nm} \leq \Delta nd \leq 253 \text{ nm} \quad \text{Formula (3A)}$$

$$223 \text{ nm} \leq \Delta nd \leq 243 \text{ nm} \quad \text{Formula (3B)}$$

When Δnd is less than 203 nm and exceeds 263 nm, the mixing of black with another color observed in the front direction that is caused when the phase difference plate of the present invention is pasted as a circularly polarizing plate to a display apparatus occurs to a large extent.

Similarly to the measurement of the helix angle, Δnd is measured by using Axoscan (polarimeter) manufactured by Axometrics, Inc. and analytical software from the same company.

Second Optically Anisotropic Layer 14b

ReB(550), which is a value of retardation of the second optically anisotropic layer 14b and measured at a wavelength of 550 nm, satisfies the following Formula (4).

$$158 \text{ nm} \leq ReB(550) \leq 218 \text{ nm} \quad \text{Formula (4)}$$

Particularly, in view of making the effects of the present invention better, ReB(550) preferably satisfies Formula (4A) and more preferably satisfies Formula (4B).

$$168 \text{ nm} \leq ReB(550) \leq 208 \text{ nm} \quad \text{Formula (4A)}$$

$$178 \text{ nm} \leq ReB(550) \leq 198 \text{ nm} \quad \text{Formula (4B)}$$

When ReB(550) is less than 158 nm and exceeds 218 nm, mixing of black with another color observed in the front direction that is caused when the phase difference plate of the present invention is pasted as a circularly polarizing plate to a display apparatus occurs to a large extent.

Similarly to the measurement of the helix angle, the value of retardation of the second optically anisotropic layer 14b is measured by a method of using Axoscan (polarimeter) manufactured by Axometrics, Inc. and analytical software from the same company.

Similarly to the second optically anisotropic layer 14a, the material constituting the second optically anisotropic layer 14b is not particularly limited as long as the second optically anisotropic layer 14b exhibits the value of retardation within the above range. For example, the second optically anisotropic layer 14b may contain the aforementioned homogeneously aligned liquid crystal compound or may be formed of a polymer film (particularly, a polymer film having undergone stretch processing).

The in-plane slow axis of the first optically anisotropic layer 12b that is in a surface 122b at the side of the second optically anisotropic layer 14b is orthogonal to the in-plane slow axis of the second optically anisotropic layer 14b. The definition of "orthogonal" is as described above.

The alignment film, which will be described later, may be disposed between the first and second optically anisotropic layers 12b and 14b. However, as shown in FIG. 2, it is preferable that the first and second optically anisotropic layers 12b and 14b be adjacent to each other and substantially not have the alignment film therebetween, similarly to the phase difference plate 10a. When the first and second optically anisotropic layers 12b and 14b substantially do not have the alignment film therebetween, covalent bonds between compounds contained in each of the optically anisotropic layers can be used, hence the adhesiveness becomes better.

Examples of materials constituting the first and second optically anisotropic layers 12b and 14b include the aforementioned materials constituting each of the first and second optically anisotropic layers 12a and 14a.

Moreover, the production method of the first and second optically anisotropic layers 12b and 14b is not particularly limited, and examples of the production method include the aforementioned production method of the first and second optically anisotropic layers 12a and 14a.

Circularly Polarizing Plate

The circularly polarizing plate of the present invention has at least the aforementioned phase difference plate (the first and second embodiments) and a polarizing film. Moreover, the circularly polarizing plate may optionally contain a transparent support.

The circularly polarizing plate of the present invention constituted as above is preferably used for preventing reflection caused in an image display apparatus such as a liquid crystal display (LCD), a plasma display panel (PDP), an electroluminescence display (ELD), or a cathode ray tube (CRT) display apparatus and is for improving a contrast ratio of display light.

For example, there is an embodiment in which the circularly polarizing plate of the present invention is used at the side of light extraction surface of an organic EL display apparatus. In this case, external light becomes linearly-polarized light by the polarizing film and then becomes circularly-polarized light by passing through the phase difference plate. When the circularly-polarized light is reflected from a metal electrode, the circularly polarized state is inverted. When the circularly-polarized light passes again through the phase difference plate, it becomes linearly polarized light inclining by 90° from the time when the light enters the phase difference plate, and reaches and is absorbed by the polarizing film. As a result, the influence of the external light can be suppressed.

First, members (a polarizing film and a transparent support) used for the circularly polarizing plate will be described, and then specific embodiments of the circular polarization plate will be described.

Polarizing Film

The polarizing film (polarizing layer) may be a member that functions to converting natural light into specific linearly-polarized light, and absorptive polarizer can be used.

The type of the polarizing film is not particularly limited, and generally used polarizing films can be used. For example, it is possible to use any of iodine-based polarizing films, dye-based polarizing films using dichroic dyes, and polyene-based polarizing films. The iodine-based polarizing films and the dye-based polarizing films are generally prepared by causing iodine or dichroic dyes to be adsorbed onto polyvinyl alcohol and stretching the resultant.

The polarizing film is generally used in the form of a polarizing plate obtained by pasting protective films to both sides thereof.

The production method of the circularly polarizing plate is not particularly limited. However, for example, it is preferable for the production method to include a step of continuously laminating a long phase difference plate and a long polarizing film on each other. The long polarizing plate is cut so as to match with the size of the screen of an image display apparatus.

For preparing a circularly polarizing plate by using the phase difference plate for a circularly polarizing plate, it is possible to directly combine the phase difference plate for a circularly polarizing plate with a polarizing film without using a transparent support which will be described later. In this case, since the circularly polarizing plate does not have the transparent support, a feature that a thin circularly polarizing plate is formed is obtained. Particularly, in an example in which excellent viewing angle characteristics are obtained by a transparent support having Rth close to 0, it is preferable not to use the transparent support because a circularly polarizing plate which is thin and also exhibits excellent viewing angle characteristics can be obtained.

The method of directly combining the phase difference plate for a circularly polarizing plate with the polarizing film includes a method of transferring and pasting the phase difference plate for a circularly polarizing plate to the polarizing film, and a method of performing alignment processing such as rubbing or UV alignment on the polarizing film and then forming the phase difference plate for a circularly polarizing plate on the polarizing film, and any of these methods can be used.

Transparent Support

The transparent support is a substrate supporting the aforementioned first and second optically anisotropic layers.

The value of retardation (Rth (550)) in the thickness direction of the transparent support at 550 nm is not particularly limited. However, in view of making the effects of the present invention better, the value is preferably −110 nm to 110 nm and more preferably −80 nm to 80 nm.

The value of in-plane retardation (Re (550)) of the transparent support at 550 nm is not particularly limited. However, the value is preferably 0 nm to 50 nm, more preferably 0 nm to 30 nm, and even more preferably 0 nm to 10 nm. If the value is within the above range, this is preferable since a degree of leakage of reflected light can be reduced to an imperceptible level.

As materials for forming the transparent support, polymers having excellent optical transparency, mechanical strength, thermal stability, moisture shielding properties, isotropy, and the like are preferable. The word "transparent" means that a visible light transmittance of the support is 60% or higher. The visible light transmittance is preferably 80% or higher and particularly preferably 90% or higher.

Examples of polymer films usable as the transparent support include cellulose acylate films (for example, cellulose triacetate films (refractive index of 1.48), cellulose diacetate films, cellulose acetate butyrate films, and cellulose acetate propionate films), polyolefin films such as polyethylene films and polypropylene films, polyester-based resin films such as polyethylene terephthalate films and polyethylene naphthalate films, polyacrylic resin films such as polyether sulfone films and polymethyl methacrylate films, polyurethane-based resin films, polyester films, polycarbonate films, polysulfone films, polyether films, polymethyl pentene films, polyether ketone films, (meth)acryl nitrile films, films of polymers having an alicyclic structure (norbornene-based resin (ARTON: trade name, manufactured by JSR Corporation, amorphous polyolefin (ZEONEX: trade name, manufactured by ZEON CORPORATION), and the like.

Among these, as materials of polymer film, triacetyl cellulose, polyethylene terephthalate, or polymers having an alicyclic structure is preferable, and triacetyl cellulose is particularly preferable.

The thickness of the transparent support is not particularly limited, and it is preferable to use a transparent support having a thickness of about 10 μm to 200 μm. The thickness is more preferably 10 μm to 100 μm, and even more preferably 20 μm to 90 μm. Moreover, the transparent support may be a laminate composed of plural layers. In order to suppress the reflection of external light, a thin transparent support is preferable. However, if the transparent support is thinner than 10 μm, this is not preferable since the film strength is weakened. In order to improve adhesiveness between the transparent support and a layer disposed on the transparent support, the transparent support may be subjected to surface processing (for example, glow discharge processing, corona discharge processing, UV processing, or flame processing).

In addition, an adhesive layer (undercoat layer) may be disposed on the transparent support. Furthermore, as a transparent support or a long transparent support, it is preferable to use a support in which a polymer layer containing inorganic particles, which have an average particle size of about 10 nm to 100 nm and are mixed with the polymer layer in a weight proportion of 5% to 40%, is formed at one side thereof by coating or co-casting with the support, such that the transparent support or the long transparent support become slidable during a transport step, or the rear surface thereof is prevented from being stuck to the front surface after the support is wound up.

Additives for Transparent Support

Various additives (for example, an optical anisotropy regulator, a wavelength dispersion regulator, fine particles, a plasticizer, a UV inhibitor, deterioration inhibitor, and a release agent) can be added to the transparent support. Moreover, when the transparent support is a cellulose acylate film, the additives may be added at any stage of a dope preparation step (preparation step of a cellulose acylate solution), and a step of adding the additives may be performed at the final stage of the dope preparation step.

Hereinafter, specific embodiments of the circularly polarizing plate will be described in detail.

First Embodiment

Figure 3:
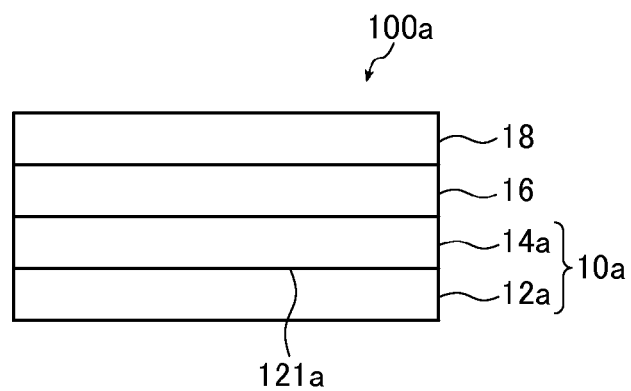
FIG. 3 is an example of a schematic cross-sectional view of a first embodiment of the circularly polarizing plate of the present invention.

As a first embodiment of the circularly polarizing plate, a circularly polarizing plate 100a which has the first optically anisotropic layer 12a, the second optically anisotropic layer 14a, a transparent support 16, and a polarizing film 18 in this order as shown in FIG. 3 is exemplified.

In the circularly polarizing plate 100a, the relationship among the absorption axis of the polarizing film 18 and the in-plane slow axes of the first optically anisotropic layer 12a and the second optically anisotropic layer 14a satisfies the following condition (X) or (Y).

(X) An angle formed between the in-plane slow axis of the second optically anisotropic layer 14a and the absorption axis of the polarizing film 18 is within a range of 13±10° (preferably within a range of 13±6°), and an angle formed between the in-plane slow axis in the surface of the first optically anisotropic layer 12a that is at the side opposite to the second optically anisotropic layer 14a and the absorption axis of the polarizing film 18 is within a range of 94±20° (preferably within a range of 94±12°).

(Y) An angle formed between the in-plane slow axis of the second optically anisotropic layer 14a and the absorption axis of the polarizing film 18 is within a range of 103±10° (preferably within a range of 103±6°), and an angle formed between the in-plane slow axis of the first optically anisotropic layer 12a that is in the surface at the side opposite to the second optically anisotropic layer 14a and the absorption axis of the polarizing film 18 is within a range of 184±20° (preferably within a range of 184±12').

As described above, the in-plane slow axis in the surface (surface 121a) of the first optically anisotropic layer 12a that is at the side of the second optically anisotropic layer 14a is in parallel with the in-plane slow axis of the second optically anisotropic layer 14b. Moreover, the helix angle of the liquid crystal compound in the first optically anisotropic layer 12a is 81±10°.

The relationship among the absorption axis of the polarizing film 18, the in-plane slow axis of the second optically anisotropic layer 14a, and the in-plane slow axis of the first optically anisotropic layer 12a that is established in the embodiment represented by the above condition (X) will be described in more detail based on FIGS. 4A and 4B.

Figure 4:
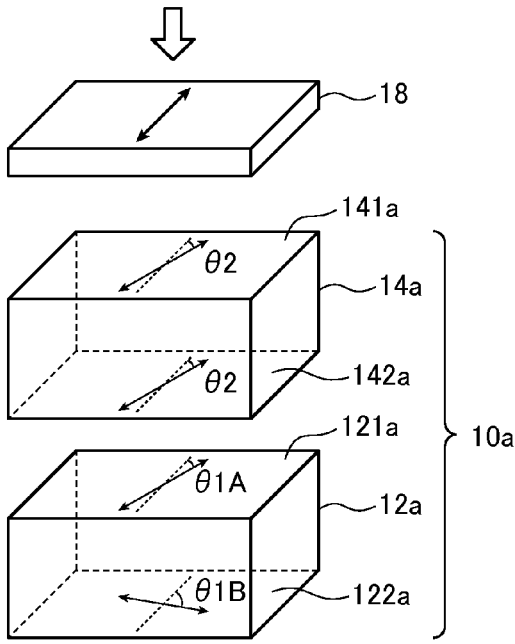
FIGS. 4A and 4B are views showing the relationship (X) between an absorption axis of a polarizing film 18 and an in-plane slow axis of each of a first optically anisotropic layer 12a and a second optically anisotropic layer 14a in an aspect of the first embodiment of the circularly polarizing plate of the present invention.
Figure 4:
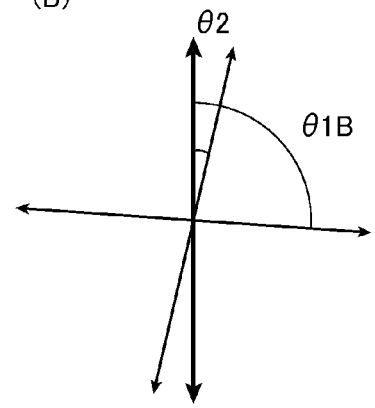

FIG. 4A shows a constitution of the circularly polarizing plate 100a shown in FIG. 3, except the transparent support 16. In FIG. 4A, the arrow in the polarizing film 18 indicates an absorption axis, and the arrows of the second optically anisotropic layer 14a and the first optically anisotropic layer 12a respectively indicate the in-plane slow axis of each of the layers. Moreover, FIG. 4B shows the angular relationship among the absorption axis of the polarizing film 18, the in-plane slow axis of the second optically anisotropic layer 14a, and the in-plane slow axis of the first optically anisotropic layer 12a that is established when the circularly polarizing plate is observed from the direction indicated by the white arrow of FIG. 4A.

In FIG. 4B, when the circularly polarizing plate is observed from the direction indicated by the white arrow of FIG. 4A, the value of the rotation angle of the in-plane slow axis is expressed as a positive value in a counter clockwise direction and as a negative value in a clockwise direction, based on the absorption axis of the polarizing film 18.

In FIGS. 4A and 4B, an angle θ2 formed between the absorption axis of the polarizing film 18 and the in-plane slow axis of the second optically anisotropic layer 14a is 13°. That is, the in-plane slow axis of the second optically anisotropic layer 14a has rotated by −13° (has rotated clockwise by 13°) relative to the absorption axis of the polarizing film 18. FIGS. 4A and 4B show an embodiment in which the in-plane slow axis of the second optically anisotropic layer 14a is in a position of −13°. However, the present invention is not limited to this embodiment, and the in-plane slow axis may be in a position within a range of −13±10°.

Moreover, as described above, the second optically anisotropic layer 14a contains a homogeneously aligned liquid crystal compound. Accordingly, the in-plane slow axis of the second optically anisotropic layer 14a that is in a surface 141a at the side of the polarizing film 18 and the in-plane slow axis of the second optically anisotropic layer 14a that is in a surface 142a at the side of the first optically anisotropic layer 12a form the approximately same angle with respect to the absorption axis of the polarizing film 18. That is, the in-plane slow axis in the surface 141a of the second optically anisotropic layer 14a is in parallel with the in-plane slow axis in the surface 142a thereof at the side of the first optically anisotropic layer 12a.

In FIGS. 4A and 4B, the in-plane slow axis in the surface 142a of the second optically anisotropic layer 14a at the side of the first optically anisotropic layer 12a is in parallel with the in-plane slow axis in the surface 121a of the first optically anisotropic layer 12a at the side of the second optically anisotropic layer 14a. That is, an angle θ1A formed between the absorption axis of the polarizing film 18 and the in-plane slow axis in the surface 121a of the first optically anisotropic layer 12a at the side of the second optically anisotropic layer 14a is approximately the same as the angle θ2 described above.

As described above, the first optically anisotropic layer 12a contains the liquid crystal compound that is helically aligned around a helical axis which is in the thickness direction of the layer. Therefore, as shown in FIG. 4A, the in-plane slow axis in the surface 121a of the first optically anisotropic layer 12a at the side of the second optically anisotropic layer 14a and the in-plane slow axis in the surface 122a of the first optically anisotropic layer 12a at the side opposite to the second optically anisotropic layer 14a form the helix angle (81° in FIGS. 4A and 4B) described above. That is, the in-plane slow axis of the first optically anisotropic layer 12a rotates by −81° (rotates clockwise by 81'). Accordingly, the angle θ1B formed between the absorption axis of the polarizing film 18 and the in-plane slow axis in the surface 122a of the first optically anisotropic layer 12a becomes 94°.

FIGS. 4A and 4B show an embodiment in which the in-plane slow axis in the surface 122a of the first optically anisotropic layer 12a has rotated by −81° relative to the in-plane slow axis in the surface 121a of the first optically anisotropic layer 12a. However, the present invention is not limited to this embodiment, and the rotation angle may be within a range of −81±10°.

Moreover, FIGS. 4A and 4B show an embodiment in which the in-plane slow axis in the surface 122a of the first optically anisotropic layer 12a is in the position of −94°. However, the present invention is not limited to this embodiment, and the axis may be in a position within a range of −94±20°.

As described above, in the embodiment shown in FIG. 4A, based on the absorption axis of the polarizing film 18, the in-plane slow axis of the second optically anisotropic layer 14a is in a position of 13° in a clockwise direction, and the liquid crystal compound in the first optically anisotropic layer 12a forms a clockwise helix (right-handed helix). In addition, regarding the helix direction, the circularly polarizing plate is observed from the direction indicated by the white arrow of FIG. 4A so as to determine whether the helix is a right-handed helix or a left-handed helix based on the in-plane slow axis in the surface (surface 121a) of the first optically anisotropic layer 12a that is at the observer's side.

FIG. 4A describes in detail an embodiment in which the in-plane slow axis of the second optically anisotropic layer 14a and the liquid crystal compound in the first optically anisotropic layer 12a form a clockwise helix. However, as long as a predetermined angular relationship is satisfied, there may be an embodiment in which the in-plane slow axis of the second optically anisotropic layer 14a and the liquid crystal compound in the first optically anisotropic layer 12a form a counter clockwise helix. More specifically, there may be an embodiment in which based on the absorption axis of the polarizing film 18, the in-plane slow axis of the second optically anisotropic layer 14a is in a position of 13° in a counter clockwise direction, and the liquid crystal compound in the first optically anisotropic layer 12a forms a counter clockwise helix (left-handed helix).

To summarize, in these embodiments, when a phase difference plate for a circularly polarizing plate 10a is observed from the polarizing film 18, and the angle formed in the counter clockwise direction is expressed as a positive value, based on the absorption axis (0°) of the polarizing film 18, the in-plane slow axis of the second optically anisotropic layer 14a is within a range of 13±10°, and the first optically anisotropic layer 12a forms a counter clockwise helix. Alternately, the in-plane slow axis of the second optically anisotropic layer 14a may be within a range of −13±10°, and the first optically anisotropic layer 12a may form a clockwise helix.

Next, the relationship among the absorption axis of the polarizing film 18, the in-plane slow axis of the second optically anisotropic layer 14a, and the in-plane slow axis of the first optically anisotropic layer 12a in the embodiment represented by the (Y) described above will be described in more detail based on FIGS. 5A and 5B.

Figure 5:
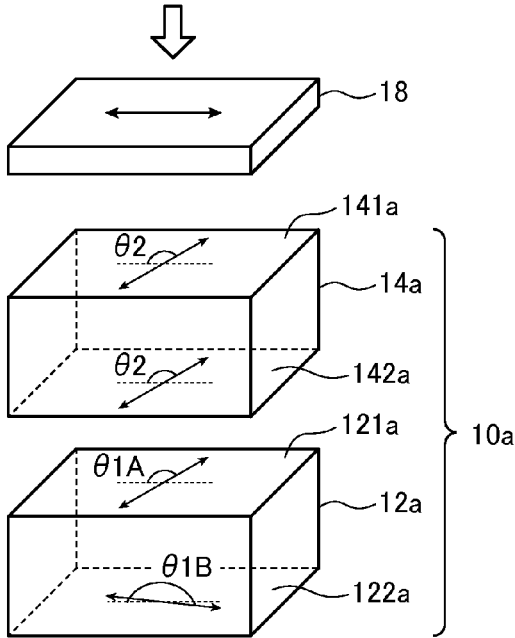
FIGS. 5A and 5B are views showing the relationship (Y) between the absorption axis of the polarizing film 18 and the in-plane slow axis of each of the first optically anisotropic layer 12a and the second optically anisotropic layer 14a in an aspect of the first embodiment of the circularly polarizing plate of the present invention.
Figure 5:
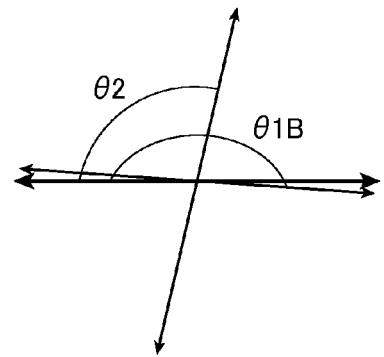

FIG. 5A shows a constitution of the circularly polarizing plate 100a shown in FIG. 3, except the transparent support 16. In FIG. 5A, the arrow in the polarizing film 18 indicates an absorption axis, and the arrows of the second and first optically anisotropic layers 14a and 12a respectively indicate the in-plane slow axis of each of the layers. Moreover, FIG. 5B shows the angular relationship among the absorption axis of the polarizing film 18, the in-plane slow axes of the second optically anisotropic layer 14a, and the in-plane slow axis of the first optically anisotropic layer 12a that is established when the circularly polarizing plate is observed from the direction indicated by the white arrow of FIG. 5A.

In FIG. 5B, when the circularly polarizing plate is observed from the direction indicated by the white arrow of FIG. 5A, the value of the rotation angle of the in-plane slow axis is expressed as a positive value in a counter clockwise direction and as a negative value in a clockwise direction, based on the absorption axis of the polarizing film 18.

The embodiment shown in FIGS. 5A and 5B is constituted in the same manner as the embodiment shown in FIGS. 4A and 4B, except that the absorption axis of the polarizing film 18 has rotated by 90° relative to the absorption axis of the polarizing film 18 in FIGS. 4A and 4B.

In FIGS. 5A and 5B, an angle θ2 formed between the absorption axis of the polarizing film 18 and the in-plane slow axis of the second optically anisotropic layer 14a is 103°. That is, the in-plane slow axis of the second optically anisotropic layer 14a has rotated by −103° (has rotated clockwise by 103°) relative to the absorption axis of the polarizing film 18. FIGS. 5A and 5B show an embodiment in which the in-plane slow axis of the second optically anisotropic layer 14a is in a position of −103°. However, the present invention is not limited to this embodiment, and the in-plane slow axis may be in a position within a range of −103±10°.

Moreover, as described above, the second optically anisotropic layer 14a contains a homogeneously aligned liquid crystal compound. Accordingly, the in-plane slow axis in the surface 141a of the second optically anisotropic layer 14a at the side of the polarizing film 18 and the in-plane slow axis in the surface 142a thereof at the side of the first optically anisotropic layer 12a form the approximately same angle with respect to the absorption axis of the polarizing film 18.

Similarly to FIGS. 4A and 4B, in FIGS. 5A and 5B, the in-plane slow axis in the surface 142a of the second optically anisotropic layer 14a at the side of the first optically anisotropic layer 12a is in parallel with the in-plane slow axis in the surface 121a of the first optically anisotropic layer 12a at the side of the second optically anisotropic layer 14a.

Similarly to FIGS. 4A and 4B, in FIGS. 5A and 5B, the in-plane slow axis in the surface 121a of the first optically anisotropic layer 12a at the side of the second optically anisotropic layer 14a and the in-plane slow axis in the surface 122a of the first optically anisotropic layer 12a at the side that is opposite to the second optically anisotropic layer 14a form the aforementioned helix angle (81° in FIGS. 5A and 5B). That is, the in-plane slow axis of the first optically anisotropic layer 12a rotates by −81° (rotates clockwise by 81'). Accordingly, an angle θ1B formed between the absorption axis of the polarizing film 18 and the in-plane slow axis in the surface 122a of the first optically anisotropic layer 12a becomes 184°.

FIGS. 5A and 5B show an embodiment in which the in-plane slow axis in the surface 122a of the first optically anisotropic layer 12a has rotated by −81° relative to the in-plane slow axis in the surface 121a of the first optically anisotropic layer 12a. However, the present invention is not limited to this embodiment, and the rotation angle may be within a range of −81±10°.

Moreover, FIGS. 5A and 5B show an embodiment in which the in-plane slow axis in the surface 122a of the first optically anisotropic layer 12a is in a position of −184° relative to the absorption axis of the polarizing film 18. However, the present invention is not limited to this embodiment, and the in-plane slow axis may be in a position within a range of −184±20°.

As described above, FIG. 5A shows an embodiment in which based on the absorption axis of the polarizing film 18, the in-plane slow axis of the second optically anisotropic layer 14a is in a position of −103°, and the liquid crystal compound in the first optically anisotropic layer 12a forms a clockwise helix (right-handed helix). Regarding the helix direction, the circularly polarizing plate is observed from the direction indicated by the white arrow of FIG. 5A so as to determine whether the helix is a right-handed helix or a left-handed helix based on the in-plane slow axis in the surface (surface 121a) of the first optically anisotropic layer 12a at the observer's side.

FIG. 4A describes in detail an embodiment in which the in-plane slow axis of the second optically anisotropic layer 14a and the liquid crystal compound in the first optically anisotropic layer 12a form a clockwise helix. However, as long as a predetermined angular relationship is satisfied, there may be an embodiment in which the in-plane slow axis of the second optically anisotropic layer 14a and the liquid crystal compound form a counter clockwise helix. More specifically, there may be an embodiment in which based on the absorption axis of the polarizing film 18, the in-plane slow axis of the second optically anisotropic layer 14a is in a position of 103°, and the liquid crystal compound in the first optically anisotropic layer 12a may form a counter clockwise helix (left-handed helix).

To summarize, in these embodiments, when the phase difference plate for a circularly polarizing plate 10a is observed from the polarizing film 18, and the angle formed in the counter clockwise direction is expressed as a positive value, based on the absorption axis (0°) of the polarizing film 18, the in-plane slow axis of the second optically anisotropic layer 14a may be within a range of 103±10°, and the first optically anisotropic layer 12a may form a counter clockwise helix. Alternately, the in-plane slow axis of the second optically anisotropic layer 14a may be within a range of −103±10°, and the first optically anisotropic layer 12a may form a clockwise helix.

In the circularly polarizing plate 100a shown in FIG. 3, when both the first optically anisotropic layer 12a and the second optically anisotropic layer 14a contain a discotic liquid crystal compound, in view of further reducing the difference in visibility between the front direction and the oblique direction at the time when the circularly polarizing plate is pasted to a display apparatus, Rth (550) of the transparent support is preferably −10 nm to 10 nm and more preferably −5 nm to 5 nm.

In the circularly polarizing plate 100a shown in FIG. 3, when the first optically anisotropic layer 12a contains a discotic liquid crystal compound, and the second optically anisotropic layer 14a contains a rod-like liquid crystal compound, in view of further reducing the difference in visibility between the front direction and the oblique direction at the time when the circularly polarizing plate is pasted to a display apparatus, Rth (550) of the transparent support is preferably −90 nm to −70 nm and more preferably −85 nm to −75 nm.

In the circularly polarizing plate 100a, when the first optically anisotropic layer 12a contains a rod-like liquid crystal compound, and the second optically anisotropic layer 14a contains a discotic liquid crystal compound, in view of further reducing the difference in visibility between the front direction and the oblique direction at the time when the circularly polarizing plate is pasted to a display apparatus, Rth (550) of the transparent support is preferably 50 nm to 70 nm and more preferably 55 nm to 65 nm.

In the circularly polarizing plate 100a, when both the first optically anisotropic layer 12a and the second optically anisotropic layer 14a contain a rod-like liquid crystal compound, in view of further reducing the difference in visibility between the front direction and the oblique direction at the time when the circularly polarizing plate is pasted to a display apparatus, Rth (550) of the transparent support is preferably −10 nm to 10 nm and more preferably −5 nm to 5 nm.

Second Embodiment

Figure 6:
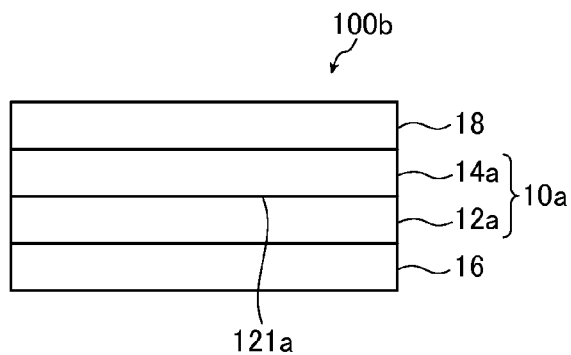
FIG. 6 is an example of a schematic cross-sectional view of a second embodiment of the circularly polarizing plate of the present invention.

As a second embodiment of the circularly polarizing plate, a circularly polarizing plate 100b which has the transparent support 16, the first optically anisotropic layer 12a, the second optically anisotropic layer 14a, and the polarizing film 18 in this order as shown in FIG. 6 is exemplified.

The circularly polarizing plate 100b shown in FIG. 6 is constituted in the same manner as the circularly polarizing plate 100a shown in FIG. 3, except that the position of the transparent support 16 is different.

In the circularly polarizing plate 100b, similarly to the circularly polarizing plate 100a, the relationship among the absorption axis of the polarizing film 18 and the in-plane slow axes of the first and second optically anisotropic layer 12a and 14a satisfies the aforementioned condition (X) or (Y).

As described above, the in-plane slow axis in the surface (surface 121a) of the first optically anisotropic layer 12a at the side of the second optically anisotropic layer 14a is in parallel with the in-plane slow axis of the second optically anisotropic layer 14a. Moreover, the helix angle of the liquid crystal compound in the first optically anisotropic layer 12a is 81±10°.

In the circularly polarizing plate 100b, when both the first optically anisotropic layer 12a and the second optically anisotropic layer 14a contain a discotic liquid crystal compound, in view of further reducing the difference in visibility between the front direction and the oblique direction at the time when the circularly polarizing plate is pasted to a display apparatus, Rth (550) of the transparent support is preferably 70 nm to 90 nm and more preferably 75 nm to 85 nm.

In the circularly polarizing plate 100b, when the first optically anisotropic layer 12a contains a discotic liquid crystal compound, and the second optically anisotropic layer 14a contains a rod-like liquid crystal compound, in view of further reducing the difference in visibility between the front direction and the oblique direction at the time when the circularly polarizing plate is pasted to a display apparatus, Rth (550) of the transparent support is preferably 50 nm to 70 nm and more preferably 55 nm to 65 nm.

In the circularly polarizing plate 100b, when the first optically anisotropic layer 12a contains a rod-like liquid crystal compound, and the second optically anisotropic layer 14a contains a discotic liquid crystal compound, in view of further reducing the difference in visibility between the front direction and the oblique direction at the time when the circularly polarizing plate is pasted to a display apparatus, Rth (550) of the transparent support is preferably −50 nm to −30 nm and more preferably −45 nm to −35 nm.

In the circularly polarizing plate 100b, when both the first optically anisotropic layer 12a and the second optically anisotropic layer 14a contain a rod-like liquid crystal compound, in view of further reducing the difference in visibility between the front direction and the oblique direction at the time when the circularly polarizing plate is pasted to a display apparatus, Rth (550) of the transparent support is preferably −70 nm to −50 nm and more preferably −65 nm to −55 nm.

Third Embodiment

Figure 7:
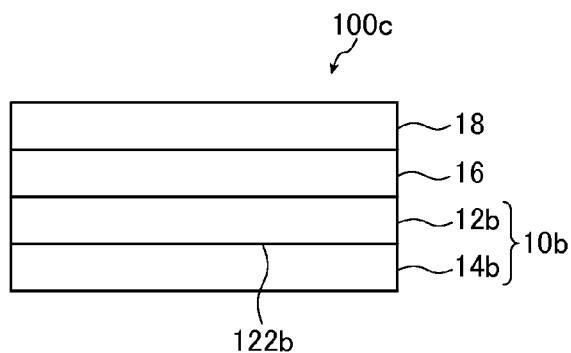
FIG. 7 is an example of a schematic cross-sectional view of a third embodiment of the circularly polarizing plate of the present invention.

As a third embodiment of the circularly polarizing plate, a circularly polarizing plate 100c which has the second optically anisotropic layer 14b, the first optically anisotropic layer 12b, the transparent support 16, and the polarizing film 18 in this order as shown in FIG. 7 is exemplified.

In the circularly polarizing plate 100c, the relationship among the absorption axis of the polarizing film 18, the in-plane slow axis of the first optically anisotropic layer 12b, and the in-plane slow axis of the second optically anisotropic layer 14b satisfies the following condition (Z) or (W).

(Z) An angle formed between the in-plane slow axis in the surface of the first optically anisotropic layer 12b at the side where the polarizing film 18 is present and the absorption axis of the polarizing film 18 is within a range of 123±10°, and an angle formed between the in-plane slow axis of the second optically anisotropic layer 14b and the absorption axis of the polarizing film 18 is within a range of 26±20°.

(W) An angle formed between the in-plane slow axis in the surface of the first optically anisotropic layer 12b at the side where the polarizing film 18 is present and the absorption axis of the polarizing film 18 is within a range of 33±10°, and an angle formed between the in-plane slow axis of the second optically anisotropic layer 14b and the absorption axis of the polarizing film 18 is within a range of 116±20°.

As described above, the in-plane slow axis in the surface (surface 122b) of the first optically anisotropic layer 12b at the side of the second optically anisotropic layer 14b is orthogonal to the in-plane slow axis of the second optically anisotropic layer 14b. Moreover, the helix angle of the liquid crystal compound in the first optically anisotropic layer 12b is 59±10°.

The relationship among the absorption axis of the polarizing film 18, the in-plane slow axis of the second optically anisotropic layer 14b, and the in-plane slow axis of the first optically anisotropic layer 12b that is established in the embodiment represented by the above condition (Z) will be described in detail based on FIGS. 8A and 8B.

Figure 8:
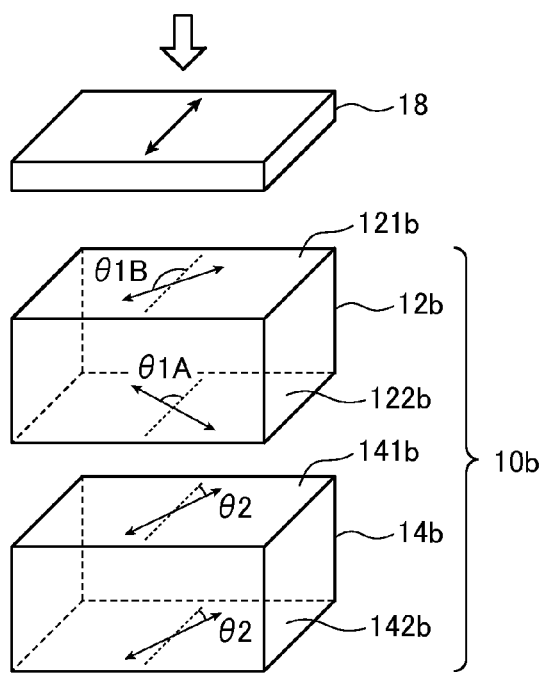
FIGS. 8A and 8B are views showing the relationship (Z) between the absorption axis of the polarizing film 18 and the in-plane slow axis of each of a first optically anisotropic layer 12b and a second optically anisotropic layer 14b in an aspect of the third embodiment of the circularly polarizing plate of the present invention.
Figure 8:
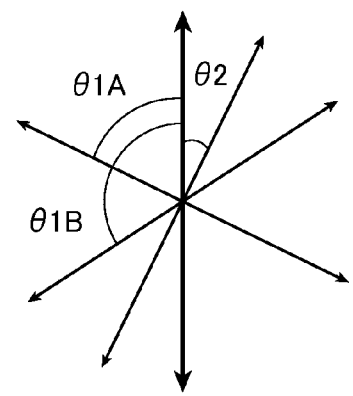

FIG. 8A shows a constitution of the circularly polarizing plate 100c shown in FIG. 7, except the transparent support 16. In FIG. 8A, the arrow in the polarizing film 18 indicates an absorption axis, and the arrows of the second optically anisotropic layer 14b and the first optically anisotropic layer 12b respectively indicate the in-plane slow axis of each of the layers. Moreover, FIG. 8B shows the angular relationship among the absorption axis of the polarizing film 18, the in-plane slow axis of the second optically anisotropic layer 14b, and the in-plane slow axis of the first optically anisotropic layer 12b that is established when the circularly polarizing plate is observed from the direction indicated by the white arrow of FIG. 8A.

In FIG. 8B, when the circularly polarizing plate is observed from the direction indicated by the white arrow of FIG. 8A, the value of the rotation angle of the in-plane slow axis is expressed as a positive value in a counter clockwise direction and as a negative value in a clockwise direction, based on the absorption axis of the polarizing film 18.

In FIGS. 8A and 8B, an angle θ1B formed between the absorption axis of the polarizing film 18 and the in-plane slow axis in the surface 121b of the first optically anisotropic layer 12b at the side of the polarizing film 18 is 123°. That is, the in-plane slow axis in the surface 121b of the first optically anisotropic layer 12b has rotated by 123° (has rotated counter clockwise by 123°) relative to the absorption axis of the polarizing film 18. FIGS. 8A and 8B show an embodiment in which the in-plane slow axis in the surface 121b of the first optically anisotropic layer 12b is in a position of 123°. However, the present invention is not limited to this embodiment, and the in-plane slow axis may be in a position within a range of 123±10°.

As described above, the first optically anisotropic layer 12b contains the liquid crystal compound that is helically aligned around a helical axis which is in the thickness direction of the layer. Therefore, as shown in FIG. 8A, the in-plane slow axis in the surface 121b of the first optically anisotropic layer 12b at the side of the polarizing film 18 and the in-plane slow axis in the surface 122b of the first optically anisotropic layer 12b at the side of the second optically anisotropic layer 14b form the helix angle (59° in FIGS. 8A and 8B) described above. That is, the in-plane slow axis of the first optically anisotropic layer 12b rotates by −59° (rotates clockwise by 59°). Accordingly, the angle θ1A formed between the absorption axis of the polarizing film 18 and the in-plane slow axis in the surface 122b of the first optically anisotropic layer 12b becomes 64°.

FIGS. 8A and 8B show an embodiment in which the in-plane slow axis in the surface 122b of the first optically anisotropic layer 12b has rotated by −59° relative to the in-plane slow axis in the surface 121b of the first optically anisotropic layer 12b. However, the present invention is not limited to this embodiment, and the rotation angle may be within a range of −59±10°.

Moreover, FIGS. 8A and 8B show an embodiment in which the in-plane slow axis in the surface 122b of the first optically anisotropic layer 12b is in the position of 64° relative to the absorption axis of the polarizing film 18. However, the present invention is not limited to this embodiment, and the axis may be in a position within a range of 64±10°.

In FIGS. 8A and 8B, the in-plane slow axis in the surface 141b of the second optically anisotropic layer 14b at the side of the first optically anisotropic layer 12a is orthogonal to the in-plane slow axis in the surface 122b of the first optically anisotropic layer 12b at the side of the second optically anisotropic layer 14b. Accordingly, the angle θ2 formed between the absorption axis of the polarizing film 18 and the in-plane slow axis in the surface 141b of the second optically anisotropic layer 14b becomes 26°.

FIGS. 8A and 8B show an embodiment in which the in-plane slow axis in the surface 141b of the second optically anisotropic layer 14b is in a position of −26° relative to the absorption axis of the polarizing film 18. However, the present invention is not limited to this embodiment, and the in-plane slow axis may be in a position within a range of −26±20°.

As described above, the second optically anisotropic layer 14b contains a homogeneously aligned liquid crystal compound. Accordingly, the in-plane slow axis in the surface 141b of the second optically anisotropic layer 14b at the side of the first optically anisotropic layer 12b and the in-plane slow axis in the surface 142b thereof at the side opposite to the first optically anisotropic layer 12b form the approximately same angle with respect to the absorption axis of the polarizing film 18. That is, the in-plane slow axis in the surface 141b of the second optically anisotropic layer 14b is in parallel with the in-plane slow axis in the surface 142b of the second optically anisotropic layer 14b.

As described above, FIG. 8A shows an embodiment in which based on the absorption axis of the polarizing film 18, the in-plane slow axis in the surface 121b of the first optically anisotropic layer 12b is in a position of 123°, and the liquid crystal compound in the first optically anisotropic layer 12a forms a clockwise helix (right-handed helix). Regarding the helix direction, the circularly polarizing plate is observed from the direction indicated by the white arrow of FIG. 8A so as to determine whether the helix is a right-handed helix or a left-handed helix based on the in-plane slow axis in the surface (surface 121b) of the first optically anisotropic layer 12b that is at the observer's side.

FIG. 8A describes in detail an embodiment in which the liquid crystal compound forms a clockwise helix. However, as long as a predetermined angular relationship is satisfied, there may be an embodiment in which an inverse relationship is established. More specifically, there may be an embodiment in which based on the absorption axis of the polarizing film 18, the in-plane slow axis in the surface 121b of the first optically anisotropic layer 12b is in a position of −123° C., and the liquid crystal compound in the first optically anisotropic layer 12a forms a counter clockwise helix (left-handed helix).

To summarize, in these embodiments, when the phase difference plate for a circularly polarizing plate 10b is observed from the polarizing film 18, and the angle formed in the counter clockwise direction is expressed as a positive value, based on the absorption axis (0°) of the polarizing film 18, the in-plane slow axis of the first optically anisotropic layer 12*b* at the side of the surface 121*b* is within a range of 123±10°, and the first optically anisotropic layer 12*a* forms a clockwise helix. Alternately, the in-plane slow axis of the first optically anisotropic layer 12*b* at the side of the surface 121*b* may be within a range of −123±10°, and the first optically anisotropic layer 12*b* may form a counter clockwise helix.

Next, the relationship among the absorption axis of the polarizing film 18, the in-plane slow axis of the second optically anisotropic layer 14*b*, and the in-plane slow axis of the first optically anisotropic layer 12*b* that is established in the embodiment represented by the aforementioned condition (W) will be described in more detail based on FIGS. 9A and 9B.

Figure 9:
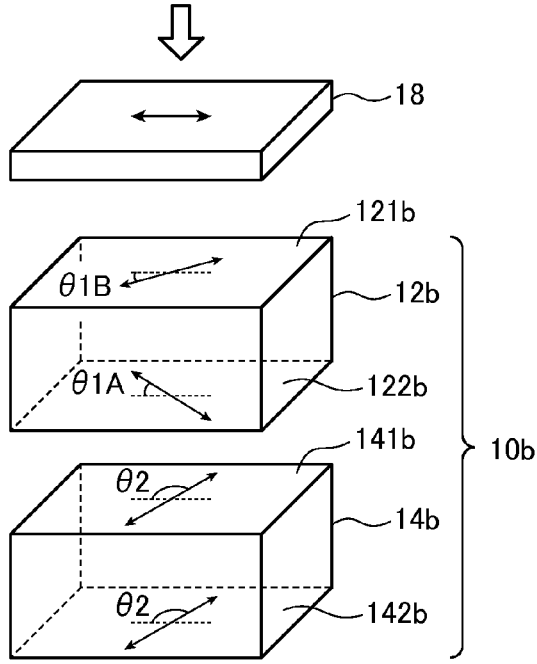
FIGS. 9A and 9B are views showing the relationship (W) between the absorption axis of the polarizing film 18 and the in-plane slow axis of each of the first optically anisotropic layer 12b and the second optically anisotropic layer 14b in an aspect of the third embodiment of the circularly polarizing plate of the present invention.
Figure 9:
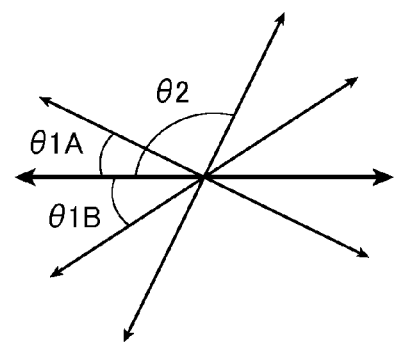

FIG. 9A shows an embodiment of the circularly polarizing plate 100*c* shown in FIG. 7, except the transparent support 16. In FIG. 9A, the arrow in the polarizing film 18 indicates an absorption axis, and the arrows of the second optically anisotropic layer 14*b* and the first optically anisotropic layer 12*b* respectively indicate the in-plane slow axis of each of the layers. Moreover, FIG. 9B shows the angular relationship among the absorption axis of the polarizing film 18, the in-plane slow axis of the second optically anisotropic layer 14*b*, and the in-plane slow axis of the first optically anisotropic layer 12*b* that is established when the circularly polarizing plate is observed from the direction indicated by the white arrow of FIG. 9A.

In FIG. 9B, when the circularly polarizing plate is observed from the direction indicated by the white arrow of FIG. 9A, the value of the rotation angle of the in-plane slow axis is expressed as a positive value in a counter clockwise direction and as a negative value in a clockwise direction, based on the absorption axis of the polarizing film 18.

The embodiment shown in FIGS. 9A and 9B is constituted in the same manner as the embodiment shown in FIGS. 8A and 8B, except that the absorption axis of the polarizing film 18 has rotated by 90° relative to the absorption axis in FIGS. 8A and 8B.

In FIGS. 9A and 9B, the angle θ1B formed between the absorption axis of the polarizing film 18 and the in-plane slow axis in the surface 121*b* of the first optically anisotropic layer 12*b* at the side of the polarizing film 18 is 33°. That is, the in-plane slow axis in the surface 121*b* of the first optically anisotropic layer 12*b* has rotated 33° (has rotated counter clockwise by 33°) relative to the absorption axis of the polarizing film 18. FIGS. 8A and 8B show an embodiment in which the in-plane slow axis in the surface 121*b* of the first optically anisotropic layer 12*b* is in a position of 33°. However, the present invention is not limited to this embodiment, and the in-plane slow axis may be in a position within a range of 33±10°.

Similarly to FIGS. 8A and 8B, in FIGS. 9A and 9B, the in-plane slow axis in the surface 121*b* of the first optically anisotropic layer 12*b* at the side of the polarizing film 18 and the in-plane slow axis in the surface 122*b* of the first optically anisotropic layer 12*b* at the side of the second optically anisotropic layer 14*a* formed the aforementioned helix angle (59° in FIGS. 9A and 9B). That is, the in-plane slow axis of the first optically anisotropic layer 12*b* rotates by −59° (rotates clockwise by 59°). Accordingly, the angle θ1A formed between the absorption axis of the polarizing film 18 and the in-plane slow axis in the surface 122*b* of the first optically anisotropic layer 12*b* becomes 26°.

FIGS. 9A and 9B show an embodiment in which the in-plane slow axis in the surface 122*b* of the first optically anisotropic layer 12*b* has rotated by −59° relative to the in-plane slow axis in the surface 121*b* of the first optically anisotropic layer 12*b*. However, the present invention is not limited to this embodiment, and the rotation angle may be within a range of −59±10°.

Moreover, FIGS. 9A and 9B show an embodiment in which the in-plane slow axis in the surface 122*b* of the first optically anisotropic layer 12*b* is in a position of −26° relative to the absorption axis of the polarizing film 18. However, the present invention is not limited to this embodiment, and the in-plane slow axis may be in a position within a range of −26±20°.

In FIGS. 9A and 9B, the in-plane slow axis in the surface 141*b* of the second optically anisotropic layer 14*b* at the side of the first optically anisotropic layer 12*a* is orthogonal to the in-plane slow axis in the surface 122*b* of the first optically anisotropic layer 12*b* at the side of the second optically anisotropic layer 14*b*. Accordingly, the angle θ2 formed between the absorption axis of the polarizing film 18 and the in-plane slow axis in the surface 141*b* of the second optically anisotropic layer 14*b* becomes 116°.

FIGS. 9A and 9B show an embodiment in which the in-plane slow axis in the surface 141*b* of the second optically anisotropic layer 14*b* is in a position of −116° relative to the absorption axis of the polarizing film 18. However, the present invention is not limited to this embodiment, and the in-plane slow axis may be in a position within a range of −116±20°.

As described above, the second optically anisotropic layer 14*b* contains a homogeneously aligned liquid crystal compound. Accordingly, the in-plane slow axis in the surface 141*b* of the second optically anisotropic layer 14*b* at the side of the first optically anisotropic layer 12*b* and the in-plane slow axis in the surface 142*b* at the side that is opposite to the first optically anisotropic layer 12*b* form the approximately same angle with respective to the absorption axis of the polarizing film 18.

As described above, FIG. 9A shows an embodiment in which based on the absorption axis of the polarizing film 18, the in-plane slow axis in the surface 121*b* of the first optically anisotropic layer 12*b* is in a position of 33°, and the liquid crystal compound in the first optically anisotropic layer 12*a* forms a clockwise helix (right-handed helix). Regarding the helix direction, the circularly polarizing plate is observed from the direction indicated by the white arrow of FIG. 9A so as to determine whether the helix is a right-handed helix or a left-handed helix based on the surface (surface 121*b*) of the first optically anisotropic layer 12*b* at the observer's side.

FIG. 9A describes in detail an embodiment in which the liquid crystal compound forms a clockwise helix. However, as long as a predetermined angular relationship is satisfied, there may be an embodiment in which an inverse relationship is established. More specifically, there may be an embodiment in which based on the absorption axis of the polarizing film 18, the in-plane slow axis in the surface 121*b* of the first optically anisotropic layer 12*b* is in a position of −33°, and the liquid crystal compound in the first optically anisotropic layer 12*a* forms a counter clockwise helix (left-handed helix).

To summarize, in these embodiments, when the phase difference plate for a circularly polarizing plate 10*b* is observed from the polarizing film 18, and the angle formed in the counter clockwise direction is expressed as a positive value, based on the absorption axis (0°) of the polarizing film 18, the in-plane slow axis at the side of the surface 121*b* of the first optically anisotropic layer 12*b* is within a range of 33±10°, and the first optically anisotropic layer 12*a* forms a clockwise helix. Alternately, the in-plane slow axis at the side of the surface 121b of the first optically anisotropic layer 12b may be within a range of −33±10°, and the first optically anisotropic layer 12b may form a counter clockwise helix.

In the circularly polarizing plate 100c, when both the first optically anisotropic layer 12b and the second optically anisotropic layer 14b contain a discotic liquid crystal compound, in view of further reducing the difference in visibility between the front direction and the oblique direction at the time when the circularly polarizing plate is pasted to a display apparatus, Rth (550) of the transparent support is preferably 70 nm to 90 nm and more preferably 75 nm to 85 nm.

In the circularly polarizing plate 100c, when the first optically anisotropic layer 12b contains a rod-like liquid crystal compound, and the second optically anisotropic layer 14b contains a discotic liquid crystal compound, in view of further reducing the difference in visibility between the front direction and the oblique direction at the time when the circularly polarizing plate is pasted to a display apparatus, Rth (550) of the transparent support is preferably −50 nm to −30 nm and more preferably −45 nm to −35 nm.

In the circularly polarizing plate 100c, when the first optically anisotropic layer 12b contains a discotic liquid crystal compound, and the second optically anisotropic layer 14b contains a rod-like liquid crystal compound, in view of further reducing the difference in visibility between the front direction and the oblique direction at the time when the circularly polarizing plate is pasted to a display apparatus, Rth (550) of the transparent support is preferably 50 nm to 70 nm and more preferably 55 nm to 65 nm.

In the circularly polarizing plate 100c, when both the first optically anisotropic layer 12b and the second optically anisotropic layer 14b contain a rod-like liquid crystal compound, in view of further reducing the difference in visibility between the front direction and the oblique direction at the time when the circularly polarizing plate is pasted to a display apparatus, Rth (550) of the transparent support is preferably −70 nm to −50 nm and more preferably −65 nm to −55 nm.

Fourth Embodiment

Figure 10:
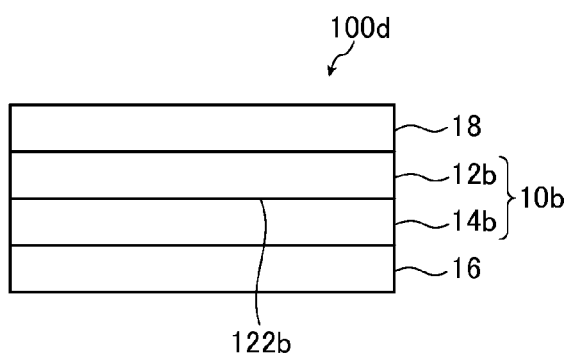
FIG. 10 is an example of a schematic cross-sectional view of a fourth embodiment of the circularly polarizing plate of the present invention.

As a fourth embodiment of the circularly polarizing plate, a circularly polarizing plate 100d which has the transparent support 16, the second optically anisotropic layer 14b, the first optically anisotropic layer 12b, and the polarizing film 18 in this order as shown in FIG. 10 is exemplified.

The circularly polarizing plate 100d shown in FIG. 10 is constituted in the same manner as the circularly polarizing plate 100c shown in FIG. 7, except that the position of the transparent support 16 is different.

Similarly to the circularly polarizing plate 100c, in the circularly polarizing plate 100d, the relationship among the absorption axis of the polarizing film 18 and the in-plane slow axes of the first optically anisotropic layer 12b and the second optically anisotropic layer 14b satisfy the above condition (Z) or (W).

Moreover, as described above, the in-plane slow axis in the surface (surface 122b) of the first optically anisotropic layer 12b at the side of the second optically anisotropic layer 14b is orthogonal to the in-plane slow axis of the second optically anisotropic layer 14b. Furthermore, the helix angle of the liquid crystal compound in the first optically anisotropic layer 12b is 59±10°.

In the circularly polarizing plate 100d, when both the first optically anisotropic layer 12b and the second optically anisotropic layer 14b contain a discotic liquid crystal compound, in view of further reducing the difference in visibility between the front direction and the oblique direction at the time when the circularly polarizing plate is pasted to a display apparatus, Rth (550) of the transparent support is preferably 30 nm to 50 nm and more preferably 35 nm to 45 nm.

In the circularly polarizing plate 100d, when the first optically anisotropic layer 12b contains a rod-like liquid crystal compound, and the second optically anisotropic layer 14b contains a discotic liquid crystal compound, in view of further reducing the difference in visibility between the front direction and the oblique direction at the time when the circularly polarizing plate is pasted to a display apparatus, Rth (550) of the transparent support is preferably −30 nm to −50 nm and more preferably −35 nm to −45 nm.

In the circularly polarizing plate 100d, when the first optically anisotropic layer 12b contains a discotic liquid crystal compound, and the second optically anisotropic layer 14b contains a rod-like liquid crystal compound, in view of further reducing the difference in visibility between the front direction and the oblique direction at the time when the circularly polarizing plate is pasted to a display apparatus, Rth (550) of the transparent support is preferably −50 nm to −30 nm and more preferably −45 nm to −35 nm.

In the circularly polarizing plate 100d, when both the first optically anisotropic layer 12b and the second optically anisotropic layer 14b contain a rod-like liquid crystal compound, in view of further reducing the difference in visibility between the front direction and the oblique direction at the time when the circularly polarizing plate is pasted to a display apparatus, Rth (550) of the transparent support is preferably −110 nm to −90 nm and more preferably −105 nm to −95 nm.

Organic EL (Electroluminescence) Display Apparatus

The organic EL display apparatus of the present invention has the aforementioned phase difference plate (or the circularly polarizing plate). Generally, the circularly polarizing plate is disposed on an organic EL panel of the organic EL display apparatus. More specifically, as shown in FIG. 11A, an organic EL display apparatus 200 has at least an organic EL panel 20, the phase difference plate 10a or 10b, and the polarizing film 18.

Figure 11:
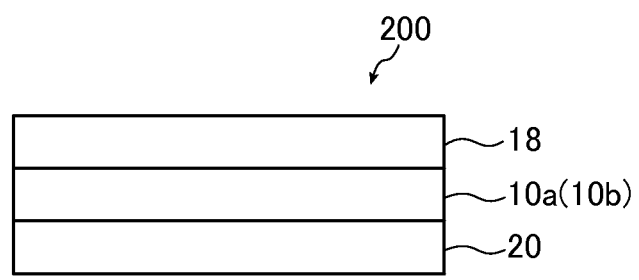
FIGS. 11A and 11B are examples of a schematic cross-sectional view of the organic EL display apparatus of the present invention.
Figure 11:
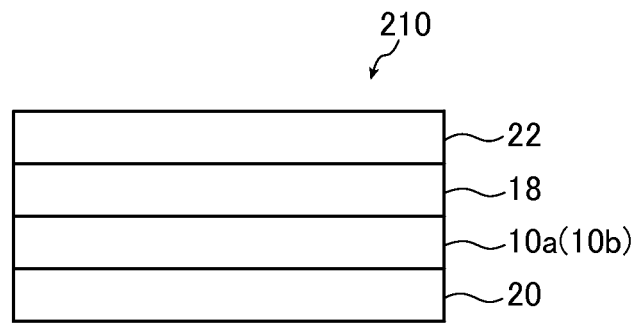

The organic EL display apparatus is not limited to the embodiment shown in FIG. 11A. As shown in FIG. 11B, an organic EL display apparatus 210 may further have a protective film 22 on the polarizing film 18.

The organic EL panel is a member having a structure in which a light emitting layer or plural thin organic compound films including the light emitting layer are formed between a pair of electrodes consisting of an anode and a cathode. The organic EL panel may have a hole injection layer, a hole transport layer, an electron injection layer, an electron transport layer, a protective layer, and the like in addition to the light emitting layer. Moreover, each of these layers may have different functions, and various materials can be used for forming each of the layers.

The anode is for supplying holes to the hole injection layer, the hole transport layer, the light emitting layer, and the like. For the anode, metals, alloys, metal oxides, electroconductive compounds, and mixtures of these can be used, and among these, materials having a work function of 4 eV or higher are preferable. Specific examples thereof include conductive metal oxides such as tin oxide, zinc oxide, indium oxide, and indium tin oxide (ITO); metals such as gold, silver, chromium, and nickel; mixtures or laminates consisting of these metals and conductive metal oxides; inorganic conductive materials such as copper iodide and copper sulfide; organic conductive materials such as polyaniline, polythiophene, and polypyrrole; laminates consisting of the organic conductive materials and ITO; and the like. Among these, conductive metal oxides are preferable, and in view of productivity, a high degree of conductivity, transparency, and the like, ITO is particularly preferable. The film thickness of the anode can be appropriately selected depending on the materials used. However, the thickness is preferably within a range of 10 nm to 5 μm in general, more preferably 50 nm to 1 μm, and even more preferably 100 nm to 500 nm.

EXAMPLES

Hereinafter, the characteristics of the present invention will be described in more detail based on examples and comparative examples. The materials, the amount thereof used, the proportion thereof, the processing method, the processing procedure, and the like described in the following examples can be appropriately modified within a range that does not depart from the gist of the present invention. Accordingly, the scope of the present invention should not be restricted by the following specific examples.

Preparation of transparent support (hereinafter, also simply referred to as a "support")

Preparation of cellulose acylate film having Rth of −80 nm to −30 nm

Preparation of Cellulose Acylate

Cellulose acylate having an entire substitution degree of 2.97 (acetyl substitution degree of 0.45; propionyl substitution degree of 2.52) was prepared. As a catalyst, a mixture of a sulphuric acid (7.8 parts by mass with respect to 100 parts by mass of cellulose) and a carboxylic acid anhydride was cooled to −20° C., then added to pulp-derived cellulose, and underwent acylation at 40° C. At this time, the type and substitution ratio of the acyl group were adjusted by varying the type and the amount of the carboxylic acid anhydride. After acylation, the mixture was allowed to mature at 40° C., whereby the entire substitution degree thereof was adjusted.

Preparation of Cellulose Acylate Solution

1) Cellulose Acylate

Cellulose acylate prepared was heated to 120° C. and dried, and was adjusted to have a water content of 0.5% by mass or less. Thereafter, 30 parts by mass of the resulting cellulose acylate was mixed with a solvent.

2) Solvent

Dichloromethane/methanol/butanol (81/15/4 parts by mass) were used for a solvent. Their water contents were each 0.2% by mass or less.

3) Additives

In every preparation of the solution, 0.9 parts by mass of trimethylolpropane triacetate was added. In addition, in every preparation of the solution, 0.25 parts by mass of silicon dioxide particle (particle size: 20 nm, Mohs hardness: about 7) was added.

4) Swelling and Dissolution

In a 400 L, stainless-steel dissolving tank having a stirring blade and having cooling water to circulate around the outer circumference thereof, the above-described solvent and additives were introduced, and the cellulose acylate was gradually added therein while the solvent and additives were being stirred and dispersed. Upon completion of introduction of the cellulose acylate, the mixture was stirred at room temperature for two hours, allowed to swell for three hours, and thereafter stirred again, whereby a cellulose acylate solution was obtained.

For stirring, a dissolver-type eccentric stirring shaft which performs stirring at a circumferential velocity of 15 m/sec (shear stress $5 \times 10^4$ kgf/m/sec$^2$) and a stirring shaft with an anchor blade on its central shaft which performs stirring at a circumferential velocity of 1 m/sec (shear stress: $1 \times 10^4$ kgf/m/sec$^2$) were used. To allow swelling, the stirring shaft for high speed stirring was stopped, and the circumferential velocity of the stirring shaft with the anchor blade was changed to 0.5 m/sec.

5) Filtration

The obtained cellulose acylate solution was filtered with a filter paper having an absolute filtering precision of 0.01 mm (#63, manufactured by Toyo Roshi Kaisha, Ltd.) and was further filtered with a filter paper having an absolute filtering precision of 2.5 μm (FH025, manufactured by Pall Corporation), whereby a cellulose acylate solution was.

Preparation of Cellulose Acylate Film

The cellulose acylate solution was heated to 30° C. and casted onto a mirror-finished stainless-steel support with a band length of 60 m, the temperature of which was set to 15° C., through a casting Gieser (described in JP H11-314233 A). The casting rate and the coating width were set to 15 m/minute and 200 cm, respectively. The spatial temperature in the entire casting section was set to 15° C. The cellulose acylate film which had been casted and rolled was then peeled from the band 50 cm before the casting section, and dry air at 45° C. was blown thereon. Subsequently, the film was dried at 110° C. for 5 minutes and further at 140° C. for 10 minutes, whereby the cellulose acylate film was obtained. The cellulose acylate film was adjusted to have a thickness of 30 μm to 100 μm. Accordingly, various cellulose acylate films having Re (550) of 5 nm or less and Rth (550) of −80 nm to −30 nm were obtained.

Preparation of Cellulose Acylate Film Having Rth of −30 nm to −5 nm

Preparation of Cellulose Acylate Solution

The composition shown below was introduced into a mixing tank and stirred to dissolve the respective components, whereby a cellulose acylate solution was prepared.

Composition of Cellulose Acylate Solution

| | |
|---|---|
| Cellulose acylate having 2.86 degree of acetylation | 100.0 parts by mass |
| Methylene chloride (first solvent) | 402.0 parts by mass |
| Methanol (second solvent) | 60.0 parts by mass |

Preparation of Additive Solution

The composition shown below was introduced into a mixing tan, heated with stirring to dissolve the respective components, whereby a cellulose acylate solution was prepared. The following compounds were used as a compound for reducing optical anisotropy (optical anisotropy-reducing compound) and a wavelength dispersion regulator.

Composition of Additive Solution

| | |
|---|---|
| Compound A-19 (retardation reducer) | 49.3 parts by mass |
| UV-102 (wavelength dispersion regulator) | 7.6 parts by mass |
| Methylene chloride (first solvent) | 58.4 parts by mass |
| Methanol (second solvent) | 8.7 parts by mass |
| Cellulose acylate solution | 12.8 parts by mass |

Preparation of Cellulose Acylate Film

After each being filtered, 94.6 parts by mass of the cellulose acylate solution and 4.1 parts by mass of the additive solution were mixed, and the mixture was casted using a band casting machine. The total amount of the additive compounds (compound A-19 and UV-102) was 13.6% by mass with respect to the amount of cellulose acylate.

The film having 30% of the residual solvent was peeled from the band and dried at 140° C. for 40 minutes, whereby a cellulose acylate film was obtained. The cellulose acylate film was adjusted to have a thickness of 30 μm to 100 μm. Accordingly, various cellulose acylate films having Re (550) of 5 nm or less and Rth (550) of −30 nm to −5 nm were obtained.

[Chem. 1]

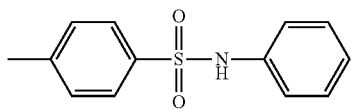

A-19

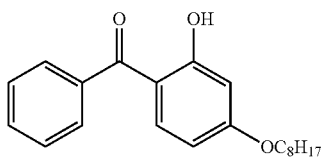

UV-102

Preparation of Cellulose Acylate Film Having Rth of 5 nm to 45 nm

Preparation of Cellulose Acylate Solution

The composition shown below was introduced into a mixing tank and stirred to dissolve the respective components, whereby a cellulose acylate solution was prepared.

Composition of Cellulose Acylate Solution

| | |
|---|---|
| Cellulose acylate having 2.86 degree of acetylation | 100.0 parts by mass |
| Triphenyl phosphate (plasticizer) | 7.8 parts by mass |
| Biphenyl diphenyl phosphate (plasticizer) | 3.9 parts by mass |
| Methylene chloride | 435.0 parts by mass |
| Methanol | 65.0 parts by mass |

Preparation of Cellulose Acylate Film

The cellulose acylate solution prepared as described above was evenly casted onto a stainless-steel band support. The solvent was evaporated on the stainless-steel band support until the residual solvent amount became 30% by mass, and the resulting film was peeled from the stainless-steel band. A tensile force was applied to the film to be stretched such that the longitudinal (MD) draw ratio became 1.02 times during the peeling process, and subsequently the film was dried by being transported for 40 minutes in a drying zone at 140° C., whereby a cellulose acylate film was obtained. The cellulose acylate film was adjusted to have a thickness of 30 μm to 100 μm. Accordingly, various cellulose acylate films having Re (550) of 5 nm or less and Rth (550) of 5 nm to 45 nm were obtained.

Preparation of Cellulose Acylate Film Having Rth of 45 nm to 100 nm

Preparation of Cellulose Acylate Solution

The composition shown below was introduced into a mixing tank and heated with stirring to dissolve the respective components, whereby a cellulose acylate solution was prepared.

Composition of Cellulose Acylate Solution

| | |
|---|---|
| Cellulose acylate having acetylation degree of 60.7% to 61.1% | 100.0 parts by mass |
| Triphenyl phosphate (plasticizer) | 7.8 parts by mass |
| Biphenyl diphenyl phosphate (plasticizer) | 3.9 parts by mass |
| Methylene chloride (first solvent) | 336.0 parts by mass |
| Methanol (second solvent) | 29.0 parts by mass |
| 1-butanole (third solvent) | 11.0 parts by mass |

In another mixing tank, 16 parts by mass of a retardation increasing agent (A) shown below, 92 parts by mass of methylene chloride and 8 parts by mass of methanol were introduced and heated with stirring, whereby a retardation increasing solution was prepared. The cellulose acylate solution and the retardation increasing solution were mixed in a mass ratio of 474 parts by mass of the cellulose acylate solution to 25 parts by mass of the retardation increasing solution and fully stirred, whereby a dope was prepared. The additive amount of the retardation increasing agent was 6.0 parts by mass with respect to 100.0 parts by mass of cellulose acylate.

[Chem. 2]

Retardation increasing agent (A)

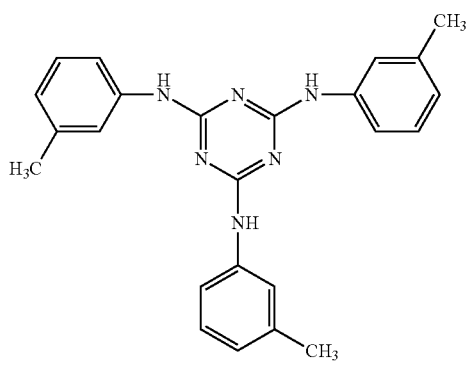

The dope obtained was casted using a band-type drawing machine. Once the temperature of the film surface on the band reached 40° C., the casted dope was dried with warm air at 70° C. for one minute. The resulting film was peeled from the band and dried with dry air at 140° C. for 10 minutes, whereby a cellulose acylate film was prepared. The cellulose acylate film was adjusted to have a film thickness of 30 μm to 100 μm. Accordingly, various cellulose acylate films having Re (550) of 5 nm or less and Rth (550) of 45 nm to 100 nm were obtained.

Preparation of Cellulose Acylate Film Having Rth of −100 nm

A cellulose acylate film was prepared in the same procedure as that of Example 15 in JP 2006-265309 A, except that drawing was not conducted. The obtained cellulose acylte film was measured for Re and Rth and was found to have Re (550)=0 nm and Rth (550)=−100 nm.

Shown below are the types of transparent supports used.

TABLE 1

| Support name | Rth | Re(550) |
|---|---|---|
| Support 1 | −100 nm | 5 nm or less |
| Support 2 | −80 nm | 5 nm or less |
| Support 3 | −60 nm | 5 nm or less |
| Support 4 | −40 nm | 5 nm or less |
| Support 5 | 0 nm | 5 nm or less |
| Support 6 | 40 nm | 5 nm or less |
| Support 7 | 60 nm | 5 nm or less |
| Support 8 | 80 nm | 5 nm or less |

Example 1

Alkaline Saponification Processing

The support 5 was passed through a dielectric heating roll at 60° C. to increase the film surface temperature to 40° C., and then the band surface of the film was coated with an alkaline solution that has the following composition by using a bar coater at a coating amount of 14 ml/m². The resultant was transported for 10 seconds under a steam-type far infrared heater manufactured by Noritake, Co, Limited, heated at 110° C., and then coated with pure water at 3 ml/m² by using the same bar coater. Thereafter, the resultant was washed three times with water by using a fountain coater, drained three times by using an air knife, and dried by being transported for 10 seconds in a drying zone at 70° C., whereby a cellulose acylate film having undergone alkaline saponification processing was prepared.

Composition of Alkaline Solution

| Composition of alkaline solution (part(s) by mass) | |
|---|---|
| Potassium hydroxide | 4.7 parts by mass |
| Water | 15.8 parts by mass |
| Isopropanol | 63.7 parts by mass |
| Surfactant | 1.0 parts by mass |
| SF-1: $C_{14}H_{29}O(CH_2CH_2O)_{20}H$ | |
| Propylene glycol | 14.8 parts by mass |

Formation of Alignment Film

The long cellulose acylate film having undergone alkaline saponification processing as described above was continuously coated with a coating liquid for alignment film having the following composition by using a #8 wire bar. The film was then dried with hot air at 100° C. for 2 minutes to obtain an alignment film having a thickness of 0.6 μm.

Modified polyvinyl alcohol was added to the coating liquid for alignment film in such an amount that yielded a solid content concentration of 4 wt %.

Composition of Coating Liquid for Alignment Film Modified Polyvinyl Alcohol Described Below

| Water | 70 parts by mass |
|---|---|
| Methanol | 30 parts by mass |

[Chem. 3]

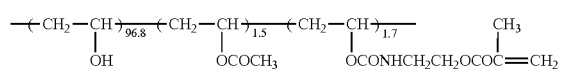

Formation of Optically Anisotropic Layer A

Rubbing processing was continuously performed on the alignment film prepared as above. At this time, the rubbing condition was regulated such that the longitudinal direction of the long film was in parallel with the transport direction thereof, and the rubbing direction relative to the longitudinal direction of the film became 13°.

Regarding the angle of the rubbing direction, when the support is observed from the surface on which the optically anisotropic layer, which will be described later, is to be laminated, the longitudinal direction of the support is regarded as being 0° as a standard. Under this condition, the angle is expressed with a positive value in the counter clockwise direction and expressed with a negative value in the clockwise direction.

Thereafter, the alignment film prepared as above was coated with the discotic liquid crystal compound-containing coating liquid (DLC (1)) described in Table 2 by using a #3 wire bar. The transport velocity (V) of the film was set to 5 m/min. In order to dry the solvent in the coating liquid and to cause the alignment of the discotic liquid crystal compound to be matured, the film was heated with hot air at 110° C. for 2 minutes. Subsequently, the film was subjected to UV irradiation (500 mJ/cm²) at 80° C. in a nitrogen atmosphere to fix the alignment of the liquid crystal compound. The thickness of the optically anisotropic layer A was 1.25 μm. Re (550) at 550 nm was 181 nm.

Formation of Optically Anisotropic Layer B

The optically anisotropic layer A prepared as above was not subjected to rubbing processing and coated with the discotic liquid crystal compound-containing coating liquid (DLC (4)) described in Table 2 by using a #3 wire bar. The transport velocity (V) of the film was set to 5 m/min. In order to dry the solvent in the coating liquid and to cause the alignment of the discotic liquid crystal compound to be matured, the film was heated with hot air at 110° C. for 2 minutes. Subsequently, the film was subjected to UV irradiation (500 mJ/cm²) at 80° C. in a nitrogen atmosphere to fix the alignment of the liquid crystal compound. The thickness of the optically anisotropic layer B was 1.19 μm. Δnd at 550 nm was 172 nm.

The in-plane slow axis in the surface of the optically anisotropic layer B at the side of the optically anisotropic layer A was in parallel with the in-plane slow axis of the optically anisotropic layer A. Moreover, the helix angle of the discotic liquid crystal compound in the optically anisotropic layer B was 81°. Furthermore, when the longitudinal direction of the support was regarded as being a standard which was 0°, the rotation angle of the in-plane slow axis in the surface of the optically anisotropic layer B at the side that was opposite to the optically anisotropic layer A was 94°. That is, the discotic liquid crystal compound forms the structure of a right-handed helix.

Regarding the rotation angle of the in-plane slow axis, the longitudinal direction of the support was regarded as being a standard which was 0°, and the support was observed from the surface on which the optically anisotropic layer is to be laminated, such that the rotation angle was expressed as a positive value in the clockwise direction and as a negative value in the counter clockwise direction.

Moreover, regarding the helix structure of the discotic liquid crystal compound, the support was observed from the surface on which the optically anisotropic layer is to be laminated so as to determine whether the in-plane slow axis makes clockwise rotation or counter clockwise rotation based on the in-plane slow axis of the surface of the optically anisotropic layer B that is at the side opposite to the optically anisotropic layer A.

Preparation of Polarizing Film

A polyvinyl alcohol (PVA) film having a thickness of 80 μm was stained by being dipped into an aqueous iodine solution with an iodine concentration of 0.05% by mass for 60 seconds at 30° C. Thereafter, while being dipped into an aqueous boric acid solution with a boric acid concentration of 4% by mass for 60 seconds, the film was stretched lengthwise to obtain a length five times longer than the original length, and then dried at 50° C. for 4 minutes, thereby obtaining a polarizing film having a thickness of 20 μm.

Preparation of Polarizing Film-Protecting Film

"TD80UL" (manufactured by Fujifilm Corporation) which is a commercially available cellulose acylate-based film was prepared and dipped into an aqueous sodium hydroxide solution of 1.5 mol/L and 55° C. Thereafter, the sodium hydroxide was sufficiently washed off by water. Subsequently, the film was dipped into an aqueous dilute sulfuric solution of 0.005 mol/L and 35° C. for 1 minute and then dipped into water to sufficiently wash off the aqueous dilute sulfuric acid solution. Finally, the sample was sufficiently dried at 120° C.

Preparation of Circularly Polarizing Plate

The aforementioned polarizing film and the polarizing film-protecting film were continuously pasted to the exposed surface of the support of the phase difference plate, which has the support and the optically anisotropic layers A and B prepared as above, by using a polyvinyl alcohol-based adhesive, thereby preparing a long circularly polarizing plate (P-1). That is, the circularly polarizing plate (P-1) has the polarizing film-protecting film, the polarizing film, the transparent support, the optically anisotropic layer A (corresponding to the aforementioned second optically anisotropic layer), and the optically anisotropic layer B (corresponding to the aforementioned first optically anisotropic layer) in this order. The order of the polarizing film, the transparent support, the optically anisotropic layer A, and the optically anisotropic layer B corresponds to the embodiment of FIG. 3 described above.

The absorption axis of the polarizing film matched with the longitudinal direction of the circularly polarizing plate, the rotation angle of the in-plane slow axis of the optically anisotropic layer A relative to the absorption axis of the polarizing film was −13°, and the rotation angle of the in-plane slow axis in the surface of the optically anisotropic layer B at the side that was opposite to the optically anisotropic layer A was −94°.

Regarding the rotation angle of the in-plane slow axis, the phase difference plate was observed from the side of the polarizing film, and the longitudinal direction of the support was regarded as being a standard which was 0°, such that the rotation angle was expressed as a positive value in the counter clockwise direction and as a negative value in the clockwise direction.

Example 2

A circularly polarizing plate (P-2) was produced according to the same procedure as in Example 1, except that the support 2 was used instead of the support 5, RLC(1) was used instead of DLC(1) for producing the optically anisotropic layer A, DLC(3) was used instead of DLC(4) for producing the optically anisotropic layer B, and the following alignment film formation step is performed between Formation of optically anisotropic layer A and Formation of optically anisotropic layer B to form the optically anisotropic layer B on the alignment film obtained.

The angular relationship among the absorption axis of the polarizing film and the in-plane slow axes of the optically anisotropic layers A and B that was established in the circularly polarizing plate (P-2) was the same as in the circularly polarizing plate (P-1).

Alignment Film Formation Step

The surface of the optically anisotropic layer A was continuously coated with a coating liquid for alignment film having the following composition by using a #8 wire bar. The film was then dried with hot air at 100° C. for 2 minutes, thereby obtaining an alignment film 1 having a thickness of 0.6 μm.

Modified polyvinyl alcohol was added to the coating liquid for alignment film in such an amount that yielded a solid content concentration of 4 wt %.

Composition of Coating Liquid for Alignment Film Modified Polyvinyl Alcohol Described Below

| Water | 70 parts by mass |
| Methanol | 30 parts by mass |

[Chem. 4]

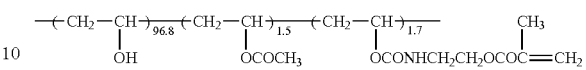

Rubbing processing was continuously performed on the alignment film prepared as above. At this time, the rubbing condition was regulated such that the longitudinal direction of the long film was in parallel with the transport direction thereof, and the rubbing direction relative to the longitudinal direction of the film became 13°.

Example 3

A circularly polarizing plate (P-3) was produced according to the same procedure as in Example 1, except that the support 7 was used instead of the support 5, and RLC(2) was used instead of DLC(4) for producing the optically anisotropic layer B.

The angular relationship between the absorption axis of the polarizing film and the in-plane slow axes of the optically anisotropic layers A and B that was established in the circularly polarizing plate (P-3) was the same as in the circularly polarizing plate (P-1).

Example 4

A circularly polarizing plate (P-4) was produced according to the same procedure as in Example 1, except that RLC(1) was used instead of DLC(1) for producing the optically anisotropic layer A, and RLC(2) was used instead of DLC(4) for producing the optically anisotropic layer B.

The angular relationship established between the absorption axis of the polarizing film in the circularly polarizing plate (P-4) and the in-plane slow axes of the optically anisotropic layers A and B was the same as that of the circularly polarizing plate (P-1).

Example 5

A phase difference plate was produced in the same manner as in Example 1 by performing Alkaline saponification processing, Formation of alignment film, Formation of optically anisotropic layer A, and Formation of optically anisotropic layer B, except that the rubbing direction relative to the longitudinal direction of the film during Formation of optically anisotropic layer A was changed to −94° from 13°, the support 8 was used instead of the support 5, DLC(3) was used instead of DLC(1) for producing the optically anisotropic layer A, and DLC(2) was used instead of DLC(4) for producing the optically anisotropic layer B.

Thereafter, the aforementioned polarizing film and the polarizing film-protecting film were continuously pasted to the exposed surface of the optically anisotropic layer B of the obtained phase difference plate by using a polyvinyl alcohol-based adhesive, thereby preparing a long circularly polarizing plate (P-5). That is, the circularly polarizing plate (P-5) has the polarizing film-protecting film, the polarizing film, the optically anisotropic layer B (corresponding to the second optically anisotropic layer), the optically anisotropic layer A (corresponding to the first optically anisotropic layer), and the transparent support in this order. The order of the polarizing film, the optically anisotropic layer B, the optically anisotropic layer A, and the transparent support corresponds to the embodiment of FIG. 6 described above.

The absorption axis of the polarizing film matched with the longitudinal direction of the circularly polarizing plate, the rotation angle of the in-plane slow axis of the optically anisotropic layer B relative to the absorption axis of the polarizing film was −13°, and the rotation angle, which is relative to the absorption axis of the polarizing film, of the in-plane slow axis in the surface of the optically anisotropic layer A at the side that was opposite to the optically anisotropic layer B was −94°.

Regarding the rotation angle of the in-plane slow axis, the phase difference plate was observed from the side of the polarizing film, and the longitudinal direction of the support was regarded as being a standard which was 0°, such that the rotation angle was expressed as a positive value in the counter clockwise direction and as a negative value in the clockwise direction.

Example 6

A circularly polarizing plate (P-6) was produced according to the same procedure as in Example 5, except that the support 7 was used instead of the support 8, and RLC(1) was used instead of DLC(2) for producing the optically anisotropic layer B.

The angular relationship among the absorption axis of the polarizing film and the in-plane slow axes of the optically anisotropic layers A and B that was established in the circularly polarizing plate (P-6) was the same as in the circularly polarizing plate (P-5).

Example 7

A circularly polarizing plate (P-7) was produced according to the same procedure as in Example 5, except that the support 4 was used instead of the support 8, RLC(2) was used instead of DLC(3) for producing the optically anisotropic layer A, DLC(1) was used instead of DLC(2) for producing the optically anisotropic layer B, the aforementioned alignment film formation step was performed between Formation of optically anisotropic layer A and Formation of optically anisotropic layer B, and the rubbing direction relative to the longitudinal direction of the film was changed to −13° from 13° to form the optically anisotropic layer B on the alignment film.

The angular relationship among the absorption axis of the polarizing film and the in-plane slow axes of the optically anisotropic layers A and B that was established in the circularly polarizing plate (P-7) was the same as in the circularly polarizing plate (P-5).

Example 8

A circularly polarizing plate (P-8) was produced according to the same procedure as in Example 5, except that the support 3 was used instead of the support 8, RLC(2) was used instead of DLC(3) for producing the optically anisotropic layer A, and RLC(1) was used instead of DLC(2) for producing the optically anisotropic layer B.

The angular relationship among the absorption axis of the polarizing film and the in-plane slow axes of the optically anisotropic layers A and B that was established in the circularly polarizing plate (P-8) was the same as in the circularly polarizing plate (P-5).

Example 9

A circularly polarizing plate (P-9) was produced according to the same procedure as in Example 1, except that the rubbing direction relative to the longitudinal direction of the film during Formation of optically anisotropic layer A was changed to −123° from 13°, the support 8 was used instead of the support 5, DLC(5) was used instead of DLC(1) for producing the optically anisotropic layer A, DLC(6) was used instead of DLC(4) for producing the optically anisotropic layer B, the aforementioned alignment film formation step was performed between Formation of optically anisotropic layer A and Formation of optically anisotropic layer B, and the rubbing direction relative to the longitudinal direction of the film was changed to 26° from 13° to form the optically anisotropic layer B on the alignment film. That is, the circularly polarizing plate (P-9) has the polarizing film-protecting film, the polarizing film, the transparent support, the optically anisotropic layer A (corresponding to the first optically anisotropic layer), and the optically anisotropic layer B (corresponding to the second optically anisotropic layer) in this order. The order of the polarizing film, the transparent support, the optically anisotropic layer A, and the optically anisotropic layer B corresponds to the embodiment of FIG. 7 described above.

The absorption axis of the polarizing film matched with the longitudinal direction of the circularly polarizing plate, the rotation angle of the in-plane slow axis of the optically anisotropic layer B relative to the absorption axis of the polarizing film was −26°, and the rotation angle relative to the absorption axis of the polarizing film, of the in-plane slow axis in the surface of the optically anisotropic layer A at the side opposite to the optically anisotropic layer B was 123°.

Regarding the rotation angle of the in-plane slow axis, when the phase difference plate is observed from the side of the polarizing film, the angle is expressed as a positive value in a counter clockwise direction and as a negative value in a clockwise direction, based on the absorption axis of the polarizing film (0°).

Example 10

A circularly polarizing plate (P-10) was produced according to the same procedure as in Example 9, except that the support 4 was used instead of the support 8, and RLC(3) was used instead of DLC(5) for producing the optically anisotropic layer A.

The angular relationship among the absorption axis of the polarizing film and the in-plane slow axes of the optically anisotropic layers A and B that was established in the circularly polarizing plate (P-10) was the same as in the circularly polarizing plate (P-9).

Example 11

A circularly polarizing plate (P-11) was produced according to the same procedure as in Example 9, except that the support 7 was used instead of the support 8, and RLC(4) was used instead of DLC(6) for producing the optically anisotropic layer B.

The angular relationship among the absorption axis of the polarizing film and the in-plane slow axes of the optically anisotropic layers A and B that was established in the circularly polarizing plate (P-11) was the same as in the circularly polarizing plate (P-9).

Example 12

A circularly polarizing plate (P-12) was produced according to the same procedure as in Example 9, except that the support 3 was used instead of support 8, RLC(3) was used instead of DLC(5) for producing the optically anisotropic layer A, and RLC(4) was used instead of DLC(6) for producing the optically anisotropic layer B.

The angular relationship among the absorption axis of the polarizing film and the in-plane slow axes of the optically anisotropic layers A and B that was established in the circularly polarizing plate (P-12) was the same as in the circularly polarizing plate (P-9).

Example 13

A phase difference plate was produced in the same manner as in Example 1 by performing Alkaline saponification processing, Formation of alignment film, Formation of optically anisotropic layer A, and Formation of optically anisotropic layer B, except that the rubbing direction relative to the longitudinal direction of the film was changed to −26° from 13° during the Formation of optically anisotropic layer A, the support 6 was used instead of the support 5, DLC(6) was used instead of DLC(1) for producing the optically anisotropic layer A, DLC(5) was used instead of DLC(4) for producing the optically anisotropic layer B, the aforementioned alignment film formation step was performed between Formation of optically anisotropic layer A and Formation of optically anisotropic layer B, and the rubbing direction relative to the longitudinal direction of the film was changed to 64° from 13° to form the optically anisotropic layer B on the alignment film.

Thereafter, the aforementioned polarizing film and the polarizing film-protecting film were continuously pasted to the exposed surface of the optically anisotropic layer B of the obtained phase difference plate by using a polyvinyl alcohol-based adhesive, thereby preparing a long circularly polarizing plate (P-13). That is, the circularly polarizing plate (P-13) has the polarizing film-protecting film, the polarizing film, the optically anisotropic layer B (corresponding to the first optically anisotropic layer), the optically anisotropic layer A (corresponding to the second optically anisotropic layer), and the transparent support in this order. The order of the polarizing film, the optically anisotropic layer B, the optically anisotropic layer A, and the transparent support corresponds to the embodiment of FIG. 10 described above.

The absorption axis of the polarizing film matched with the longitudinal direction of the circularly polarizing plate, the rotation angle of the in-plane slow axis of the optically anisotropic layer A relative to the absorption axis of the polarizing film was −26°, and the rotation angle, which is relative to the absorption axis of the polarizing film, of the in-plane slow axis in the surface of the optically anisotropic layer B at the side that was opposite to the optically anisotropic layer A was 123°.

Regarding the rotation angle of the in-plane slow axis, the phase difference plate was observed from the side of the polarizing film, and the longitudinal direction of the support was regarded as being a standard which was 0°, such that the rotation angle was expressed as a positive value in the counter clockwise direction and as a negative value in the clockwise direction.

Example 14

A circularly polarizing plate (P-14) was produced according to the same procedure as in Example 13, except that the support 4 was used instead of the support 6, and RLC(3) was used instead of DLC(5) for producing the optically anisotropic layer B.

The angular relationship among the absorption axis of the polarizing film and the in-plane slow axes of the optically anisotropic layers A and B that was established in the circularly polarizing plate (P-14) was the same as in the circularly polarizing plate (P-13).

Example 15

A circularly polarizing plate (P-15) was produced according to the same procedure as in Example 13, except that the support 4 was used instead of the support 6, and RLC(4) was used instead of DLC(6) for producing the optically anisotropic layer A.

The angular relationship among the absorption axis of the polarizing film and the in-plane slow axes of the optically anisotropic layers A and B that was established in the circularly polarizing plate (P-15) was the same as in the circularly polarizing plate (P-13).

Example 16

A circularly polarizing plate (P-16) was produced according to the same procedure as in Example 13, except that the support 1 was used instead of the support 6, RLC(4) was used instead of DLC(6) for producing the optically anisotropic layer A, and RLC(3) was used instead of DLC(5) for producing the optically anisotropic layer B.

The angular relationship among the absorption axis of the polarization film and the in-plane slow axes of the optically anisotropic layers A and B that was established in the circularly polarizing plate (P-16) was the same as in the circularly polarizing plate (P-13).

The following Table 2 shows the compositions of DLC(1) to DLC(6) and RLC(1) to RLC(4) used in Examples 1 to 16.

When the optically anisotropic layer was prepared using any one of DLC(1) to DLC(6) or RLC(1) to RLC(4), an alignment temperature, an alignment time, and a polymerization temperature were set according to the condition shown in Table 2.

Moreover, in Examples 1 to 8 described above, the relationship among the absorption axis of the polarizing film and each of in-plane slow axes of the first and second optically anisotropic layers corresponds to the embodiment of FIGS. 4A and 4B described above.

Furthermore, in Examples 9 to 16 described above, the relationship among the absorption axis of the polarizing film and each of in-plane slow axes of the first and second optically anisotropic layers corresponds to the embodiment of FIGS. 8A and 8B described above.

TABLE 2

| | DLC(1) | DLC(2) | DLC(3) | DLC(4) | DLC(5) | DLC(6) | RLC(1) | RLC(2) | RLC(3) | RLC(4) |
|---|---|---|---|---|---|---|---|---|---|---|
| Liquid crystal compound | Compound 1 (100 parts by mass) | | | | | | Compound 2 (100 parts by mass) | | | |
| Initiator | Irgacure 907 manufactured by CIBA-GEIGY CORP (3 parts by mass) | | | | | | | | | |

TABLE 2-continued

| | DLC(1) | DLC(2) | DLC(3) | DLC(4) | DLC(5) | DLC(6) | RLC(1) | RLC(2) | RLC(3) | RLC(4) |
|---|---|---|---|---|---|---|---|---|---|---|
| Sensitizer | Kayacure DETX manufactured by NIPPON KAYAKU Co., Ltd. (1 part by mass) | | | | | | | | | |
| Alignment assistant agent | Compound 3 (0.2 parts by mass) | None | Compound 3 (0.2 parts by mass) | None | Compound 3 (0.2 parts by mass) | | None | | | |
| Air interface alignment agent | None | | | | | | Compound 4 (0.2 parts by mass) | | | |
| Chiral agent | None | | Paliocolor LC756, manufactured by BASF (4 parts by mass) | | Paliocolor LC756, manufactured by BASF (2.5 parts by mass) | None | Paliocolor LC756, manufactured by BASF (0.40 parts by mass) | Paliocolor LC756, manufactured by BASF (0.25 parts by mass) | | None |
| Solvent | Methyl ethyl ketone | | | | | | | | | |
| Solid content concentration | 21.4 wt % | | 20.4 wt % | | 27.7 wt % | 21.3 wt % | 19.9 wt % | 18.9 wt % | 25.5 wt % | 19.6 wt % |
| Alignment temperature | | | 110° C. | | | | 95° C. | | | |
| Alignment time | | | 2 minutes | | | | 1.5 minutes | | | |
| Polymerization temperature | | | 80° C. | | | | 60° C. | | | |

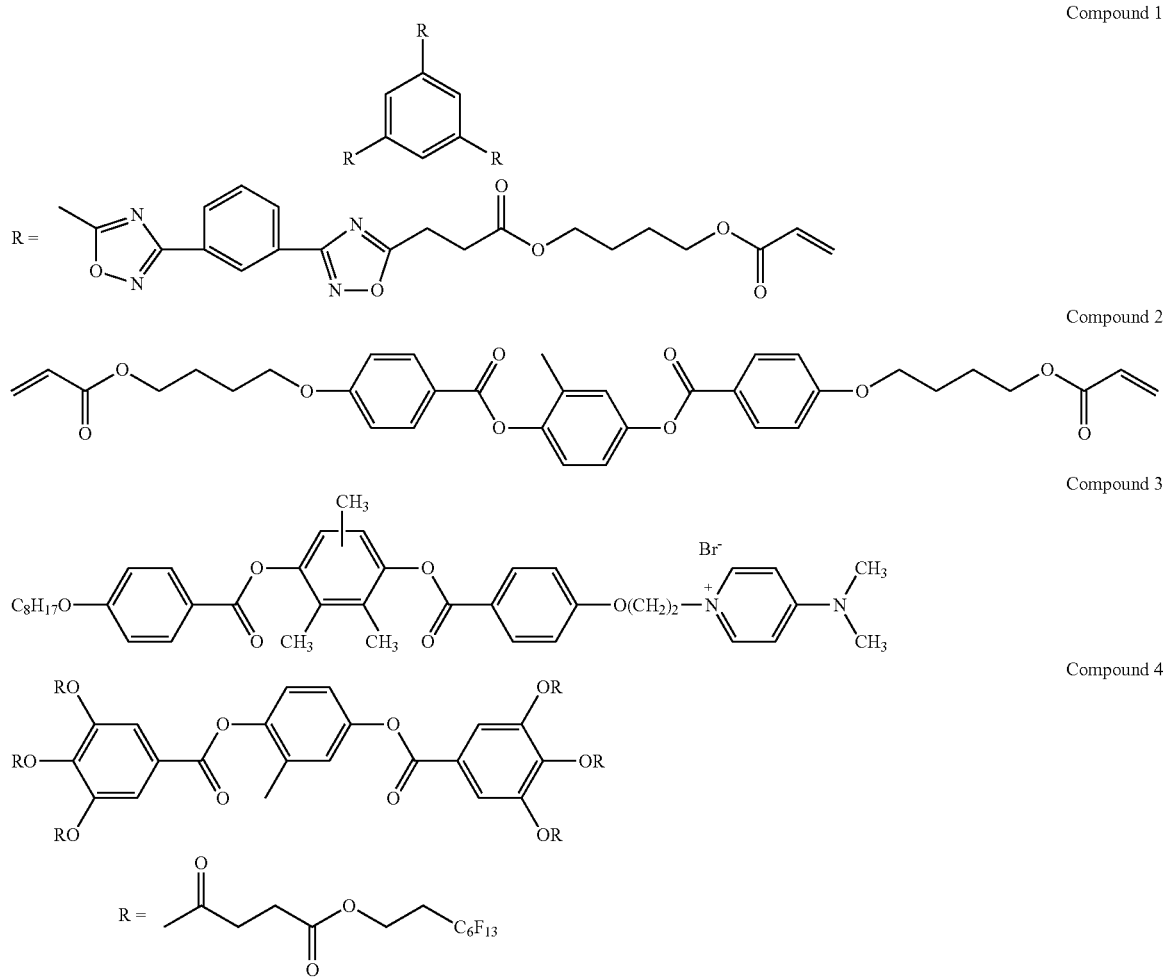

[Chem. 5]

Compound 1

Compound 2

Compound 3

Compound 4

The results of the above examples are summarized below.

In Examples 1 to 16, Δnd retardation of the optically anisotropic layers A and B, and the angle formed between these layers and the absorption axis of the polarizing film were measured by using Axoscan manufactured by Axometrics, Inc.

Moreover, regarding the angle of the rubbing direction in Tables 3 to 6, the support was observed from the surface on which the optically anisotropic layer is to be laminated, and at this time, the longitudinal direction of the support was being regarded as 0° as a standard such that the rubbing direction was expressed as a positive angle value in the counter clockwise direction and as a negative angle value in the clockwise direction.

Meanwhile, regarding the rotation angle of the in-plane slow axes of the optically anisotropic layers A and B relative to the absorption axis of the polarizing film, the phase difference plate was observed from the side of the polarizing film such that the rotation angle was expressed as a positive value in the counter clockwise direction and as a negative value in the clockwise direction, based on the longitudinal direction, which was regarded as being 0°, of the support.

TABLE 3

|  |  | Example 1 | Example 2 | Example 3 | Example 4 |
|---|---|---|---|---|---|
| Optically anisotropic layer B (second layer) | Coating liquid | DLC(4) | DLC(3) | RLC(2) | RLC(2) |
|  | Helix angle (°) | 81 | 81 | 81 | 81 |
|  | Δnd(550 nm)(nm) | 172 | 172 | 172 | 172 |
|  | Alignment film | None | Alignment film 1 | None | None |
|  | Rubbing direction (°) | None | 13 | None | None |
| Optically anisotropic layer A (first layer) | Coating liquid | DLC(1) | RLC(1) | DLC(1) | RLC(1) |
|  | Re(550 nm)(nm) | 181 | 181 | 181 | 181 |
|  | Alignment film | Alignment film 1 | | | |
|  | Rubbing direction (°) | 13 | 13 | 13 | 13 |
| Type of support |  | Support 5 | Support 2 | Support 7 | Support 5 |
| Constitution of circularly polarizing plate |  | The polarizing film, the support, the optically anisotropic layer A (corresponding to the second optically anisotropic layer), and the optically anisotropic layer B (corresponding to the first optically anisotropic layer) are laminated on one another in this order | | | |
| Rotation angle (°) of slow axis of optically anisotropic layer A relative to absorption axis of polarizing film |  | −13 | | | |
| Rotation angle (°), which is relative to absorption axis of polarizing film, of slow axis in surface of optically anisotropic layer B at the side that is opposite to optically anisotropic layer A |  | −94 | | | |

TABLE 4

|  |  | Example 5 | Example 6 | Example 7 | Example 8 |
|---|---|---|---|---|---|
| Optically anisotropic layer B (second layer) | Coating liquid | DLC(2) | RLC(1) | DLC(1) | RLC(1) |
|  | Re(550 nm)(nm) | 181 | 181 | 181 | 181 |
|  | Alignment film | None | None | Alignment film 1 | None |
|  | Rubbing direction (°) | None | None | −13 | None |
| Optically anisotropic layer A (first layer) | Coating liquid | DLC(3) | DLC(3) | RLC(2) | RLC(2) |
|  | Helix angle (°) | 81 | 81 | 81 | 81 |
|  | Δnd(550 nm)(nm) | 172 | 172 | 172 | 172 |
|  | Alignment film | Alignment film 1 | | | |
|  | Rubbing direction (°) | −94 | −94 | −94 | −94 |
| Type of support |  | Support 8 | Support 7 | Support 4 | Support 3 |
| Constitution of circularly polarizing plate |  | The polarizing film, the optically anisotropic layer B (corresponding to the second optically anisotropic layer), the optically anisotropic layer A (corresponding to the first optically anisotropic layer), and the support are laminated on one another in this order | | | |
| Rotation angle (°) of slow axis of optically anisotropic layer B relative to absorption axis of polarizing film |  | −13 | | | |
| Rotation angle (°), which is relative to absorption axis of polarizing film, of slow axis in surface of optically anisotropic layer A at the side that is opposite to optically anisotropic layer B |  | −94 | | | |

TABLE 5

|  |  | Example 9 | Example 10 | Example 11 | Example 12 |
|---|---|---|---|---|---|
| Optically anisotropic layer B (second layer) | Coating liquid | DLC(6) | DLC(6) | RLC(4) | RLC(4) |
|  | Re(550 nm)(nm) | 188 | 188 | 188 | 188 |
|  | Alignment film | Alignment film 1 | | | |
|  | Rubbing direction (°) | 26 | 26 | 26 | 26 |
| Optically anisotropic layer A (first layer) | Coating liquid | DLC(5) | RLC(3) | DLC(5) | RLC(3) |
|  | Helix angle (°) | 59 | 59 | 59 | 59 |
|  | Δnd(550 nm)(nm) | 233 | 233 | 233 | 233 |
|  | Alignment film | Alignment film 1 | | | |
|  | Rubbing direction (°) | −123 | −123 | −123 | −123 |
| Type of support | | Support 8 | Support 4 | Support 7 | Support 3 |
| Constitution of circularly polarizing plate | | The polarizing film, the support, the optically anisotropic layer A (corresponding to the first optically anisotropic layer), and the optically anisotropic layer B (corresponding to the second optically anisotropic layer) are laminated on one another in this order | | | |
| Rotation angle (°) of slow axis of optically anisotropic layer B relative to absorption axis of polarizing film | | −26 | | | |
| Rotation angle (°), which is relative to absorption axis of polarizing film, of slow axis in surface of optically anisotropic layer A at the side that is opposite to optically anisotropic layer B | | 123 | | | |

TABLE 6

|  |  | Example 13 | Example 14 | Example 15 | Example 16 |
|---|---|---|---|---|---|
| Optically anisotropic layer B (second layer) | Coating liquid | DLC(5) | RLC(3) | DLC(5) | RLC(3) |
|  | Helix angle (°) | 59 | 59 | 59 | 59 |
|  | Δnd(550 nm)(nm) | 233 | 233 | 233 | 233 |
|  | Alignment film | Alignment film 1 | | | |
|  | Rubbing direction (°) | 64 | 64 | 64 | 64 |
| Optically anisotropic layer A (first layer) | Coating liquid | DLC(6) | DLC(6) | RLC(4) | RLC(4) |
|  | Re(550 nm)(nm) | 188 | 188 | 188 | 188 |
|  | Alignment film | Alignment film 1 | | | |
|  | Rubbing direction (°) | −26 | −26 | −26 | −26 |
| Type of support | | Support 6 | Support 4 | Support 4 | Support 1 |
| Constitution of circularly polarizing plate | | The polarizing film, the optically anisotropic layer B (corresponding to the first optically anisotropic layer), the optically anisotropic layer A (corresponding to the second optically anisotropic layer), and the support are laminated on one another in this order | | | |
| Rotation angle (°) of slow axis of optically anisotropic layer A relative to absorption axis of polarizing film | | −26 | | | |
| Rotation angle (°), which is relative to absorption axis of polarizing film, of slow axis in surface of optically anisotropic layer B at the side that is opposite to optically anisotropic layer A | | 123 | | | |

Comparative Examples 1 and 2

Polycarbonate having a weight average molecular weight of 100,000 was dissolved in methylene chloride to obtain a solution of 18% by mass. The solution was casted on a glass plate such that the thickness of the dry film became 80 μm. The film was dried for 30 minutes at room temperature and then dried for 1 hour at 70° C. The polycarbonate film was peeled from the glass plate, cut in a size of 10 cm×20 cm, and stretched by 4% in the longitudinal direction at 160° C., thereby obtaining a λ/4 plate as a phase difference plate. Moreover, a λ/2 plate as a phase difference plate was obtained according to the same procedure as described above, except that the polycarbonate film was stretched by 8% at 160° C. The in-plane slow axis of each of the phase difference plates was in parallel with the longitudinal direction of the film. The value of retardation at a wavelength of 550 nm was 137.5 nm in the λ/4 plate, and was 275 nm in the λ/2 plate.

The aforementioned polarizing film and polarizing film-protecting film were pasted onto the λ/4 phase difference plate prepared as above by using a polyvinyl alcohol-based adhesive, such that the in-plane slow axis of the phase difference plate crossed the absorption axis of the polarizing film at 45°, thereby preparing a circularly polarizing plate (Comparative example 1). That is, the circularly polarizing plate has the polarizing film-protecting film, the polarizing film, and the λ/4 plate in this order.

Moreover, the λ/2 plate was pasted onto the λ/4 plate prepared as above by using an adhesive, such that the in-plane slow axes of each of the plates crossed each other at 60° C. Furthermore, the aforementioned polarizing film and the polarizing film-protecting film were pasted onto the λ/2 phase difference plate by using a polyvinyl alcohol-based adhesive, such that the in-plane slow axis of the λ/2 phase difference plate crossed the absorption axis of the polarizing film at 15°, thereby preparing a circularly polarizing plate (Comparative example 2). That is, the circularly polarizing plate (Comparative example 2) has the polarizing film-protecting film, the polarizing film, the λ/2 plate, and the λ/4 plate in this order.

The angle formed between the absorption axis of the polarizing film and the in-plane slow axis of the λ/2 plate was 15°, and the angle formed between the absorption axis of the polarizing film and the in-plane slow axis of the λ/4 plate was 75°.

Mounting of circularly polarizing plate on organic EL device and evaluation of display performance Mounting of circularly polarizing plate on display apparatus An organic EL panel-mounted GALAXY SII manufactured by SAMSUNG was disassembled, and a circularly polarizing plate was peeled from the apparatus. Thereafter, the circularly polarizing plate prepared in Examples 1 to 19 and Comparative examples 1 and 2 were pasted to the display apparatus such that the polarizing film-protecting film was disposed in the outside.

Evaluation of Display Performance

Evaluation of Color Mixing

The prepared organic EL display apparatus was evaluated in terms of the mixing of black with another color. The display apparatus was caused to display black, observed from the front, and evaluated based on the following criteria. The results are summarized in Tables 7 and 8.

4: Color mixing is not observed at all. (Acceptable)
3: Color mixing is extremely slightly observed. (Acceptable)
2: Both the color mixing and reflected light are slightly observed, and this is unacceptable.
1: Color mixing is observed, and reflected light is observed to a large extent. This is unacceptable.

Visibility

The organic EL display apparatus prepared was evaluated in terms of the visibility and display quality under bright light. The display apparatus was caused to display white, black, and an image, and reflected light that was caused when fluorescent light is thrown to the apparatus from the front and at a polar angle of 45° was observed. The display quality obtained when light was thrown to the apparatus at a polar angle of 45° was compared to the display quality obtained when light was thrown thereto from the front, and evaluated based on the following criteria. The results are summarized in Tables 7 and 8.

4: Color mixing is not observed at all. (Acceptable)
3: Color mixing is extremely slightly observed. (Acceptable)
2: Color mixing is observed, but reflected light is observed to a small extent. This is unproblematic for use. (Acceptable)
1: Color mixing is observed, and reflected light is observed to a large extent. This is unacceptable.

Dust-Related Display Quality

Deterioration of display quality caused by dust was evaluated based on the following criteria. The results are summarized in Tables 7 and 8.

4: Deterioration of display quality due to dust is not observed at all. (Acceptable)
3: Deterioration of display quality due to dust is extremely slightly observed. (Acceptable)
2: Deterioration of display quality due to dust is observed, but this is unproblematic for use. (Acceptable)
1: Deterioration of display quality due to dust is remarkably observed, and this is unacceptable.

TABLE 7

|  | Example 1 | Example 2 | Example 3 | Example 4 | Example 5 | Example 6 | Example 7 | Example 8 |
| --- | --- | --- | --- | --- | --- | --- | --- | --- |
| Evaluation of color mixing | 4 | 4 | 4 | 4 | 4 | 4 | 4 | 4 |
| Visibility under bright light | 4 | 4 | 4 | 4 | 4 | 4 | 4 | 4 |
| Dust-related display quality | 4 | 3 | 4 | 4 | 4 | 4 | 3 | 4 |

TABLE 8

|  | Example 9 | Example 10 | Example 11 | Example 12 | Example 13 | Example 14 | Example 15 | Example 16 | Comparative example 1 | Comparative example 2 |
| --- | --- | --- | --- | --- | --- | --- | --- | --- | --- | --- |
| Evaluation of color mixing | 4 | 4 | 4 | 4 | 4 | 4 | 4 | 4 | 1 | 2 |
| Visibility under bright light | 4 | 4 | 4 | 4 | 4 | 4 | 4 | 4 | 1 | 2 |
| Dust-related display quality | 3 | 3 | 3 | 3 | 3 | 3 | 3 | 3 | 4 | 3 |

As shown in Tables 7 and 8, it was confirmed that the use of the phase difference plate of the invention of the present application suppresses color mixing.

It was also confirmed that when an alignment film is not disposed between the optically anisotropic layers A and B, the deterioration of the display quality due to light spots caused by dust is suppressed, and the display quality is further improved.

In Comparative example 1 using the λ/4 plate and Comparative example 2 using the λ/4 plate and λ/2 plate, results of the evaluation of color mixing were poor.

In Examples 1 to 16, the polarizing film was pasted to the phase difference plate such that the absorption axis of the polarizing film was in parallel with the longitudinal direction of the support. However, even when the polarizing film was pasted to the phase difference plate such that an angle of 90° was formed between the absorption axis of the polarizing film and the longitudinal direction of the support, the result of both the evaluation of color mixing and evaluation of visibility satisfied the criterion "4". Further, in examples not having an alignment film, the result of the evaluation of dust-related display quality satisfied the criterion "4" similarly to the above, and in examples having an alignment film, the result of the evaluation of dust-related display quality satisfied the criterion "3".

When an angle of 90° is formed between the absorption axis of the polarizing film and the longitudinal direction of the support as described above, the angular relationship among the absorption axis of the polarizing film and the in-plane slow axes of the first and second optically anisotropic layers satisfies the aforementioned relationship (Y) or (W). That is, the embodiment, in which the polarizing film is pasted to the phase difference plate such that an angle of 90° is formed between the absorption axis of the polarizing film and the longitudinal direction of the support, corresponds to the embodiments of FIGS. 5A, 5B, 9A, and 9B.

In the above examples, the first optically anisotropic layer was produced by using a liquid crystal compound forming a right-handed helical structure. However, even when a liquid crystal compound forming a left-handed helical structure was used, by adjusting the relationship among the absorption axis of the polarizing film, the in-plane slow axis of the first optically anisotropic layer, and the in-plane slow axis of the second optically anisotropic layer as described above, a circularly polarizing plate having desired characteristics could be formed.

The invention claimed is:

1. A phase difference plate for a circularly polarizing plate comprising:
    a first optically anisotropic layer; and
    a second optically anisotropic layer,
    wherein the first optically anisotropic layer contains a liquid crystal compound that is helically aligned around a helical axis which is in a thickness direction of the first optically anisotropic layer,
    a helix angle of the liquid crystal compound in the first optically anisotropic layer is 81±10°,
    an in-plane slow axis in a surface of the first optically anisotropic layer at the second optically anisotropic layer side is in parallel with an in-plane slow axis of the second optically anisotropic layer, and
    a value of Δnd, which is a product of a refractive index anisotropy Δn of the first optically anisotropic layer measured at a wavelength of 550 nm and a thickness d of the first optically anisotropic layer, and ReB(550) which is a value of retardation of the second optically anisotropic layer measured at a wavelength of 550 nm satisfy the following Formulae (1) and (2) respectively:

$142 \text{ nm} \leq \Delta nd \leq 202 \text{ nm}$; and        Formula (1)

$151 \text{ nm} \leq ReB(550) \leq 211 \text{ nm}$.        Formula (2)

2. The phase difference plate for a circularly polarizing plate according to claim 1,
    wherein the second optically anisotropic layer contains a homogeneously aligned liquid crystal compound.

3. The phase difference plate for a circularly polarizing plate according to claim 2,
    wherein the liquid crystal compound is a discotic liquid crystal compound or a rod-like liquid crystal compound.

4. The phase difference plate for a circularly polarizing plate according to claim 2,
    wherein there is substantially no alignment film between the first optically anisotropic layer and the second optically anisotropic layer.

5. A circularly polarizing plate at least comprising:
    a polarizing film; and
    the phase difference plate for a circularly polarizing plate according to claim 2,
    wherein the polarizing film, the second optically anisotropic layer, and the first optically anisotropic layer are laminated on one another in this order, and
    an angle formed between the in-plane slow axis of the second optically anisotropic layer and an absorption axis of the polarizing film is within a range of 13±10°, and an angle formed between the in-plane slow axis in a surface of the first optically anisotropic layer at a side opposite to the second optically anisotropic layer and the absorption axis of the polarizing film is within a range of 94±20°, or
    the angle formed between the in-plane slow axis of the second optically anisotropic layer and the absorption axis of the polarizing film is within a range of 103±10°, and the angle formed between the in-plane slow axis in the surface of the first optically anisotropic layer at a side opposite to the second optically anisotropic layer and the absorption axis of the polarizing film is within a range of 184±20°.

6. The phase difference plate for a circularly polarizing plate according to claim 1,
    wherein the liquid crystal compound is a discotic liquid crystal compound or a rod-like liquid crystal compound.

7. The phase difference plate for a circularly polarizing plate according to claim 6,
    wherein there is substantially no alignment film between the first optically anisotropic layer and the second optically anisotropic layer.

8. The phase difference plate for a circularly polarizing plate according to claim 1,
    wherein there is substantially no alignment film between the first optically anisotropic layer and the second optically anisotropic layer.

9. A circularly polarizing plate at least comprising:
    a polarizing film; and
    the phase difference plate for a circularly polarizing plate according to claim 1,
    wherein the polarizing film, the second optically anisotropic layer, and the first optically anisotropic layer are laminated on one another in this order, and
    an angle formed between the in-plane slow axis of the second optically anisotropic layer and an absorption axis of the polarizing film is within a range of 13±10°, and an angle formed between the in-plane slow axis in a surface of the first optically anisotropic layer at a side opposite to the second optically anisotropic layer and the absorption axis of the polarizing film is within a range of 94±20°, or
    the angle formed between the in-plane slow axis of the second optically anisotropic layer and the absorption axis of the polarizing film is within a range of 103±10°, and the angle formed between the in-plane slow axis in the surface of the first optically anisotropic layer at a side opposite to the second optically anisotropic layer and the absorption axis of the polarizing film is within a range of 184±20°.

10. An organic electroluminescence display apparatus comprising:
    the phase difference plate according to claim 1.

11. A phase difference plate for a circularly polarizing plate comprising:
    a first optically anisotropic layer; and
    a second optically anisotropic layer,
    wherein the first optically anisotropic layer contains a liquid crystal compound that is helically aligned around an helical axis which is in a thickness direction of the first optically anisotropic layer,
    a helix angle of the liquid crystal compound in the first optically anisotropic layer is 59±10°,
    an in-plane slow axis in a surface of the first optically anisotropic layer at the second optically anisotropic layer side is orthogonal to an in-plane slow axis of the second optically anisotropic layer, and a value of Δnd, which is a product of a refractive index anisotropy Δn of the first optically anisotropic layer measured at a wavelength of 550 nm and a thickness d of the first optically anisotropic layer, and ReB(550) which is a value of retardation of the second optically anisotropic layer measured at a wavelength of 550 nm satisfy the following Formulae (3) and (4) respectively:

$$203\ nm \leq \Delta nd \leq 263\ nm;\ and \qquad \text{Formula (3)}$$

$$158\ nm \leq ReB(550) \leq 218\ nm. \qquad \text{Formula (4)}$$

12. The phase difference plate for a circularly polarizing plate according to claim 11,
wherein the second optically anisotropic layer contains a homogeneously aligned liquid crystal compound.

13. The phase difference plate for a circularly polarizing plate according to claim 12,
wherein the liquid crystal compound is a discotic liquid crystal compound or a rod-like liquid crystal compound.

14. The phase difference plate for a circularly polarizing plate according to claim 12,
wherein there is substantially no alignment film between the first optically anisotropic layer and the second optically anisotropic layer.

15. A circularly polarizing plate at least comprising:
a polarizing film; and
the phase difference plate for a circularly polarizing plate according to claim 12,
wherein the polarizing film, the first optically anisotropic layer, and the second optically anisotropic layer are laminated on one another in this order, and
an angle formed between the in-plane slow axis in a surface of the first optically anisotropic layer at the polarizing film side and the absorption axis of the polarizing film is within a range of 123±10°, and an angle formed between the in-plane slow axis of the second optically anisotropic layer and the absorption axis of the polarizing film is within a range of 26±20°, or
the angle formed between the in-plane slow axis in the surface of the first optically anisotropic layer at the polarizing film side and the absorption axis of the polarizing film is within a range of 33±10°, and the angle formed between the in-plane slow axis of the second optically anisotropic layer and the absorption axis of the polarizing film is within a range of 116±20°.

16. The phase difference plate for a circularly polarizing plate according to claim 11,
wherein the liquid crystal compound is a discotic liquid crystal compound or a rod-like liquid crystal compound.

17. The phase difference plate for a circularly polarizing plate according to claim 16,
wherein there is substantially no alignment film between the first optically anisotropic layer and the second optically anisotropic layer.

18. The phase difference plate for a circularly polarizing plate according to claim 11,
wherein there is substantially no alignment film between the first optically anisotropic layer and the second optically anisotropic layer.

19. A circularly polarizing plate at least comprising:
a polarizing film; and
the phase difference plate for a circularly polarizing plate according to claim 11,
wherein the polarizing film, the first optically anisotropic layer, and the second optically anisotropic layer are laminated on one another in this order, and
an angle formed between the in-plane slow axis in a surface of the first optically anisotropic layer at the polarizing film side and the absorption axis of the polarizing film is within a range of 123±10°, and an angle formed between the in-plane slow axis of the second optically anisotropic layer and the absorption axis of the polarizing film is within a range of 26±20°, or
the angle formed between the in-plane slow axis in the surface of the first optically anisotropic layer at the polarizing film side and the absorption axis of the polarizing film is within a range of 33±10°, and the angle formed between the in-plane slow axis of the second optically anisotropic layer and the absorption axis of the polarizing film is within a range of 116±20°.

20. An organic electroluminescence display apparatus comprising:
the phase difference plate according to claim 11.

* * * * *